(12) United States Patent
Karnezos

(10) Patent No.: US 6,373,131 B1
(45) Date of Patent: *Apr. 16, 2002

(54) TBGA SEMICONDUCTOR PACKAGE

(75) Inventor: Marcos Karnezos, Menlo Park, CA (US)

(73) Assignee: Signetics, Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 09/467,539

(22) Filed: Dec. 10, 1999

Related U.S. Application Data

(63) Continuation of application No. 08/892,471, filed on Jul. 14, 1997, now Pat. No. 6,020,637.
(60) Provisional application No. 60/045,963, filed on May 7, 1997.

(51) Int. Cl.[7] .......................... H01L 23/34; H01L 23/48
(52) U.S. Cl. .................. 257/712; 257/738; 257/774; 257/780; 438/108; 438/122
(58) Field of Search .................. 257/684, 712, 257/737, 738, 774, 779, 780; 438/15, 25, 26, 108, 122

(56) References Cited

U.S. PATENT DOCUMENTS

| | | | |
|---|---|---|---|
| 5,240,588 A | 8/1993 | Uchida | 205/125 |
| 5,397,921 A | 3/1995 | Karnezos | 257/779 |
| 5,420,460 A | 5/1995 | Massingill | 257/693 |
| 5,455,456 A | 10/1995 | Newman | 257/704 |
| 5,583,378 A | 12/1996 | Marrs et al. | 257/710 |
| 5,633,533 A | 5/1997 | Andros et al. | 257/707 |
| 5,640,047 A | 6/1997 | Nakashima | 257/738 |
| 5,663,530 A | 9/1997 | Schueller et al. | 174/260 |
| 5,710,459 A | 1/1998 | Teng et al. | 257/717 |
| 5,739,581 A | 4/1998 | Chillara et al. | 257/668 |
| 5,773,884 A | 6/1998 | Andros et al. | 257/707 |
| 5,832,596 A | 11/1998 | Chiu | 29/830 |
| 5,844,168 A | 12/1998 | Schueller et al. | 174/52.4 |
| 6,023,098 A | * 2/2000 | Higashiguchi et al. | 257/712 |

* cited by examiner

Primary Examiner—Allan R. Wilson
(74) Attorney, Agent, or Firm—Martine & Penilla, LLP

(57) ABSTRACT

Disclosed is a semiconductor package arrangement. The package arrangement includes a heat spreader for dissipating heat generated within the semiconductor package arrangement. The package further includes a ground plane having a first side that is attached to the heat spreader with an electrically insulating adhesive. The ground plane has a first aperture defining a path to a surface of the heat spreader that is configured to receive a semiconductor die. An interconnect substrate is adhesively attached to the ground plane, and the interconnect substrate has a complementary second aperture over the first aperture of the ground plane. Preferably, the interconnect substrate has a plurality of metal patterns for electrically interconnecting the semiconductor die to electrical connections that are external to the semiconductor package arrangement. The package arrangement further includes at least one conductively filled via that is defined through the interconnect substrate and is in electrical contact with the ground plane to establish a direct ground connection from selected ones of the plurality of metal patterns of the interconnect substrate. Preferably, a second side of the ground plane includes patterned wetable platting pads over selected regions that are in electrical contact with the at least one conductively filled via that is defined through the interconnect substrate.

5 Claims, 17 Drawing Sheets

TBGA SEMICONDUCTOR PACKAGE

CROSS REFERENCE TO RELATED APPLICATIONS

This is a Continuation application of prior application Ser. No. 08/892,471 filed on Jul. 14, 1997, now U.S. Pat. No. 6,020,637, the disclosure of which is incorporated herein by reference.

This application claims the benefit of U.S. Provisional Patent Application having U.S. Ser. No. 60/045,963, filed on May 7, 1997, entitled "Ball Grid Array Package with Heatspreader and Ground Plane," which is hereby incorporated by reference.

BACKGROUND OF THE INVENTION

1. Field of the Invention

The present invention relates generally to the packaging of integrated circuits, and more particularly to ball grid array (BGA) semiconductor device packages and methods for cost effectively manufacturing such packages.

2. Description of the Related Art

The continuous increase in performance of integrated circuits is having a proportionate increase in demand for integrated circuit packages that dissipate heat more efficiently, operate under higher clock frequencies, and produce smaller footprints while meeting increased reliability requirements. There are a number of packaging technologies that offer some of these properties, but fail to meet others. Multi-layer ceramic and deposited thin film BGAs are among some of the high performance solutions commonly available today. Unfortunately, these solutions tend to be prohibitively expensive, and therefore fail to meet the highly competitive cost structure associated with high volume packaging operations. As such, the high cost of packaging materials and package manufacturing limit their use in cost sensitive high performance products.

FIG. 1 shows a prior art "cavity down" BGA package 5 having a multi-layer printed circuit board (PCB) substrate and a metal heat spreader 10 as disclosed by R. C. Marrs et al. in U.S. Pat. No. 5,583,378. In the illustrated construction, the cavity is defined by PCB interconnect metal layers 14, 16 and 18, which are patterned over dielectric layers 24. In this example, the multiple layer PCB is formed by alternating layers of metal (i.e., 14, 16 and 18) and dielectric layers (i.e., 24), which may be a BT resin dielectric available from Mitsubishi Gas & Chemical Co. of Japan. Bonding shelves 28 are defined as part of each of the patterned metal layers 14 and 16, and are used for wire bonds 26. In this manner, wire bonds 26 may be electrically interconnected to a semiconductor die 12 that is shown attached to the heat spreader 10 with a die attach epoxy 13.

To complete the electrical interconnections between metal layers, a plurality of vias 30 may be used. In typical BGA designs that implement PCB technology (where the minimum metal trace width is about 100 microns), at least four metal layers are needed to interconnect about five rows of solder balls 20, and even more metal layers are needed when power and ground planes are required. As a result, the PCB substrate alone inevitably grows to thicknesses greater than 0.7 mm, thereby substantially increasing the cost of manufacturing the packaging arrangement. Further, thicker substrates have poor heat dissipation performance and reduced package reliability. Further yet, the multiple metal layers required to complete complex circuit routing tends to increase the number of metal traces and via interconnects. Unfortunately, an increase in trace length and density typically contributes to an increase in trace inductance as well as electrical noise associated with electrical reflections. Each of these side effects represent exemplary drawbacks of a conventional packaging arrangement.

To accommodate thicker dies 12, designers typically increase the thickness of dielectric layers, such as the dielectric layer 24 that is interposed between the heat spreader 10 and metal layer 14. Though this serves to increase the cavity depth, the increased thickness will act to degrade heat dissipation while providing no improvement in electrical performance. Further, when die 12 is encapsulated with an encapsulant 22 and subjected to high solder reflow temperatures (i.e., 220 degrees Celsius or higher), the inherently poor heat dissipation characteristics of the packaging arrangement 5 may cause the die 12 and other package layers to delaminated. Accordingly, when heat is inadequately dissipated, the packaged arrangement will be more susceptible to over heating failures.

FIG. 2 is another example of a cavity down BGA package 50 having a "flex tape interconnect substrate" 16 attached to a heat spreader 10 as disclosed by M. Karnezos in U.S. Pat. No. 5,397,921, and hereby incorporated by reference. In this example, a cavity 15 is an integral feature of the heat spreader 10, that is typically defined by an etching operation. A particular drawback of etching is that the side walls of cavity 15 may be quite uneven and sometimes produces pointy edges around the mouth of the cavity 15. These pointy edges act as stress concentration points which cause cracks in the encapsulation and in turn reduce the package reliability.

The flex tape interconnect substrate 16 is a "one-metal layer" interconnect substrate that is attached directly to the heat spreader 10 via an adhesive 23. In the example shown, the flex tape interconnect substrate 16 is designed such that a gold or silver plated ground ring 21, of the heat spreader 10, is left exposed around a cavity 15. The plated ground ring 21 is therefore made available for wire bonds 26" that connect to die 12. Other bonding wires 26' may typically be used for interconnecting die 12 to various signal, power and ground lines that interconnect to selected solder balls 20.

The flex tape interconnect substrate 16 also includes a first dielectric layer 25, a single metal routing layer 18' and a second dielectric 36. Typical flex tape interconnect substrates are usually custom ordered to a packaging designer's specifications from companies such as Sumitomo Metal and Mining Co. of Japan. As is well known, when complex applications demand additional signal routing to the die 12, additional solder balls 20 will be needed, thereby requiring the flex tape interconnect substrate to have more than one metal layer. Although multi-metal flex tape interconnect substrates may be designed, the overall semiconductor package cost can potentially double with each additional metal layer.

Although the semiconductor die 12 being directly attached to the cavity 15 provides a lower heat resistive path through the heat spreader compared to the package of FIG. 1, the package may suffer from delamination at the interface between the die attach epoxy 13 and the heat spreader 10. The delamination is believed to occur when cavity 15 begins to bow in response to increased temperatures produced when semiconductor die 12 is operational. In fact, because the cavity 15 bottom is only about one third the thickness of the heat spreader 10 main body, it will naturally tend to bow and differentially expand under elevated temperatures.

A number of techniques used to combat delamination include increasing the adhesion strength of the die attach epoxy 13 and encapsulation 22 to the cavity 15 surfaces. The increased adhesion is typically achieved by treating the cavity 15 surfaces with a thick metal oxide. However, applying the thick metal oxide to the cavity 15 surfaces is very expensive. In addition, the thick metal oxide is incompatible with the silver plating operations used on the one-piece heat spreader 10, thereby requiring more expensive gold plating operations.

The encapsulation compound 22 also naturally absorbs moisture that may be confined within the cavity 15. As is well known, when moisture is confined within encapsulated cavities, the confined moisture becomes expanding steam during subsequent solder reflow operations that range in temperatures up to 220 degrees Celsius. Naturally, the confined steam expands in an outward direction causing a well known "popcorn" cracking in the encapsulation 22.

As such, the cost of a typical one-piece heat spreader is particularly high due to the multiple fabrication operations needed to etch the cavity 15 to a sufficient depth, and metal oxide coatings. Furthermore, because heat spreaders are typically manufactured in strips having a number of package sites, if one package site is defective, the entire strip is oftentimes scrapped in an attempt to minimize losses.

In view of the foregoing, there is a need for a ball grid array (BGA) semiconductor device package that is cost effective and easy to manufacture with existing manufacturing equipment. There is also a need for a packaging method that enables the production of high yields while providing a semiconductor package that is practical for high performance applications.

SUMMARY OF THE INVENTION

Broadly speaking, the present invention fills these needs by providing a semiconductor BGA package having a functional ground plane and a heat spreading base. The present invention also provides a method for efficient manufacturing semiconductor packages that increase yield, provide high performance packages and reduce manufacturing costs. In general, the BGA package in accordance with one embodiment of the present invention also provides improved heat dissipation, lower electrical noise, and improved density. Further yet, the BGA package of the present invention is thinner, lighter and is less expensive to manufacture compared to prior art BGA packages. Several embodiments of the present invention are described below.

In one embodiment, a semiconductor package arrangement is disclosed. The package arrangement includes a heat spreader for dissipating heat generated within the semiconductor package arrangement. The package further includes a ground plane having a first side that is attached to the heat spreader with an electrically insulating adhesive. The ground plane has a first aperture defining a path to a surface of the heat spreader that is configured to receive a semiconductor die. An interconnect substrate is adhesively attached to the ground plane, and the interconnect substrate has a complementary second aperture over the first aperture of the ground plane. Preferably, the interconnect substrate has a plurality of metal patterns for electrically interconnecting the semiconductor die to electrical connections that are external to the semiconductor package arrangement. The package arrangement further includes at least one conductively filled via that is defined through the interconnect substrate and is in electrical contact with the ground plane to establish a direct ground connection from selected ones of the plurality of metal patterns of the interconnect substrate. Preferably, a second side of the ground plane includes patterned wetable platting pads over selected regions that are in electrical contact with the at least one conductively filled via that is defined through the interconnect substrate.

In another embodiment, a "flip chip" semiconductor package includes a heat spreader for dissipating heat generated within the semiconductor package. The package further includes a ground plane having a first side that is attached to the heat spreader with an electrically insulating adhesive. Preferably, the ground plane has a first aperture exposing a surface of the heat spreader. In addition, a first side of a semiconductor die is attached to the heat spreader surface defined by the first aperture, and a second side of the semiconductor die has a plurality of input/output pads that are in electrical contact with a plurality of solder bumps. An interconnect substrate is adhesively attached to the ground plane, and the interconnect substrate has a plurality of metal patterns for electrically interconnecting the semiconductor die to electrical connections that are external to the semiconductor package. The plurality of metal patterns includes a plurality of metal bump pads that are configured to meet associated ones of the plurality of solder bumps that are on the second side of the semiconductor die. The package further includes a conductively filled via defined through the interconnect substrate and in electrical contact with the ground plane to establish a direct ground connection from selected ones of the plurality of metal patterns of the interconnect substrate.

In another embodiment, a method for manufacturing a ball grid array semiconductor package is disclosed. The method includes providing a ground plane strip having a plurality of package sites. Stamping a first aperture through the ground plane for each of the plurality of package sites, and joining the ground plane strip to a heat spreader strip. The method then attaches an interconnect substrate to each of the plurality of package sites on the ground plane strip. Preferably, the method further includes stamping a second aperture that is larger than the first aperture through the interconnect substrate before attaching the interconnect substrate to the ground plane strip, such that the second aperture is substantially aligned with the first aperture. In a preferred embodiment, the method further includes stamping at least one via hole through the interconnect substrate at substantially the same time the second aperture in the interconnect substrate is stamped.

The packages of the above described embodiments have several notable advantages over the prior art. These packages use cost effective one-metal flex tape interconnect substrates to achieve the high electrical performance usually achieved by more expensive multi-metal flex tape interconnect substrates. The metal layer of the interconnect substrate may be used for signal and power connections and the ground plane for all necessary ground connections. This is a distinct advantage compared to the prior art package of FIG. 2 which does not have an active, current-carrying ground plane.

Accordingly, because substantially all ground connections may be made in the ground plane, there is no electrical parasitics associated with trace inductance and therefore ground noise is substantially reduced. In one embodiment, the metal traces of the interconnect substrate are preferably uniformly spaced from the ground plane with a dielectric layer, thereby enabling more control over their electrical impedance which is very desirable in high clock frequency systems. Further, the ground plane provides an electrical shield against unwanted electromagnetic radiation, thereby reducing electro-magnetic interference to and from the integrated circuit. Reducing electro-magnetic interference is particularly advantageous in high frequency systems of modern electronic products where components are closely spaced apart.

The thermal resistance theta j-a of the present invention is also advantageously lower compared to the prior art packages. Because the interconnect substrate has a thickness that is as low as 0.125 mm, a much lower thermal resistance is experienced as compared to comparable PCB substrate thicknesses, that are typically about 0.70 mm or thicker. For example, an increase of 0.075 mm in the dielectric layer of the interconnect substrate may increase the thermal resistance theta j-a by about 0.75 C/W. Proportionately, the 0.70 mm thick PCB substrate can result in a significant increase of about 5.0 C/W in theta j-a. Therefore, the relatively thin interconnect substrate in accordance with one embodiment of the present invention enables an efficient heat flow from the ground plane, through the interconnect substrate, to the solder balls and then to the product mother board. Accordingly, superior heat dissipation is achieved.

Because the interconnect substrate is relatively thin, the overall thickness of the package can be reduced to about 1.0 mm or thinner, compared to prior art packages that may only be reduced to about 1.4 mm. The advantageously thin package size is in part due to the thin interconnect substrate (e.g., about 0.15 mm) and that the thinly stamped-out ground plane and heat spreader (e.g., about 0.15–0.2 mm). It is noted that the etching process used in the prior art package of FIG. 2, is not able to uniformly etch out a cavity of about 0.25 mm deep within tight tolerances of about 0.025 mm. Likewise, the prior art package of FIG. 1 uses an interconnect substrate that has a minimum thickness of 0.7 mm, and therefore cannot achieve an overall thickness of about 1.0 mm.

Furthermore, because the present invention implements substantially thinner metal layers, the resulting package is much lighter than prior art packages. As a result, the light package of the present invention is very desirable in new smaller products that emphasize compact sizes and also incorporate the newer generations of integrated circuits that require greater heat dissipation for the higher clock frequency operational demands.

It should also be noted that the cost of the one-piece heat spreader of the prior art package of FIG. 2 leads to be significantly higher than the combined cost of the ground plane and heat spreader of the present invention. For example, the fabrication of the one-piece heat spreaders of FIG. 2 require expensive etching and plating with multiple masking steps as compared to the present invention that implements stamping and only one masking step for plating the ground plane.

In sum, the BGA packages described above combine the cost effective features of the one-metal layer flex tape interconnect substrate and the assembly techniques of plastic packages. Advantageously, this results in a method that produces ball grid array packages that dissipate heat much more efficiently, can operate at higher clock frequencies, are more reliable, are thinner and lighter, and are lower cost compared to prior art ball grid array packages. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements, and in which.

DETAILED DESCRIPTION OF THE PREFERRED EMBODIMENTS

An invention for a semiconductor package having a functional ground plane and a heat spreading base is disclosed. The present invention also provides a method for efficient manufacturing of semiconductor packages that increase yield, provide high performance and reduce manufacturing costs. In the following description, numerous specific details are set forth in order to provide a thorough understanding of the present invention. It will be understood, however, to one skilled in the art, that the present invention may be practiced without some or all of these specific details. In other instances, well known process operations have not been described in detail, as they are well known to those skilled in the art.

I. Semiconductor Package Embodiments

Figure 3A:
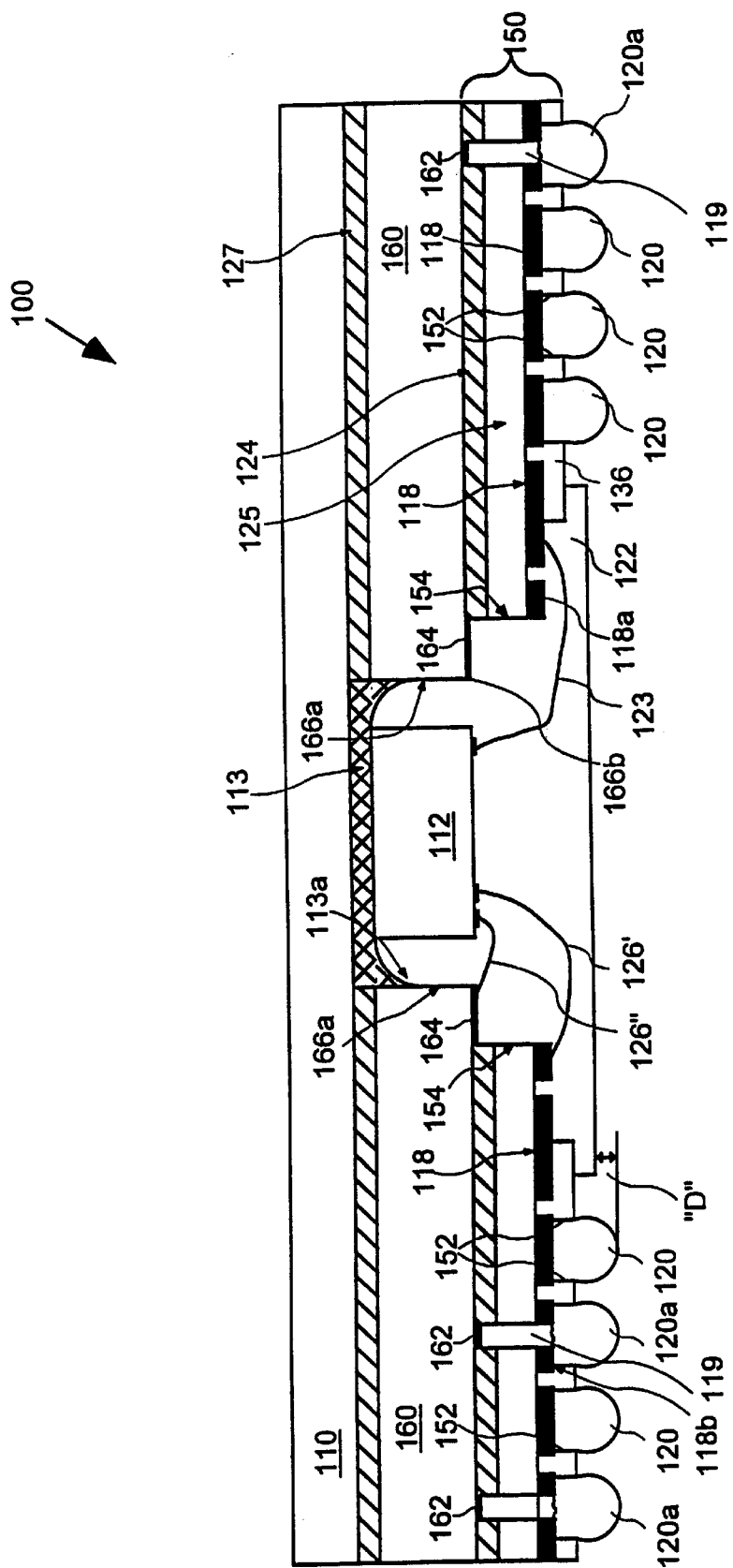
FIG. 3A is a cross sectional view of a ball grid array package having a heat spreader, a ground plane and a single metal layer flex tape interconnect substrate wire bonded to the semiconductor die in accordance with one preferred embodiment of the invention.

FIG. 3A is a cross sectional view of a wire bonded version of a ball grid array (BGA) package 100 in accordance with one embodiment of the present invention. As shown, BGA package 100 includes a heat spreader 110 having a semiconductor die 112 attached with a die attach epoxy 113 and a ground plane 160 having a flex tape interconnect substrate 150. Preferably, the ground plane 160 is attached to the heat spreader 110 by an adhesive layer 127 which is first attached to the ground plane 160 and then to the heat spreader 110. The die 112 has a first surface that is attached via the die attach adhesive 113 to the heat spreader 110 in a package cavity defined by the ground plane 160 and flex tape interconnect substrate 150. The die attach adhesive 113 can be any number of well known adhesives including a silver filled epoxy that provides excellent thermal and electrical conductivity, or any others having strong adhesion properties.

In one embodiment, the first surface of the die 112 is electrically connected to the ground plane 160 by dispensing additional silver filled die attach epoxy 113 to contact the ground plane walls 166a at a point 113a. When additional silver filled die attach epoxy 113 is used, the first surface of the semiconductor die 112 is advantageously maintained at substantially the same electrical potential as the ground plane 160. Of course, the semiconductor die 112 has a second surface that contains the electrical contacts called bond pads that enable external electrical connections.

Preferably, the flex tape interconnect substrate 150 includes an adhesive layer 124 that is used to secure a first dielectric layer 125 to the ground plane 160. As mentioned earlier, flex tape interconnect substrate 150 can be custom ordered to routing specifications from a number of companies such as Sumitomo Metal and Mining Co. of Japan. As such, a patterned metal layer 118 is routed between the first dielectric layer 125 and a second dielectric layer 136. The second dielectric layer 136 is typically a solder mask having circular apertures called pad openings 152. The pad openings are generally about 0.1 mm smaller in diameter than the diameter of the underlying ball pads patterned by the metal layer 118. Preferably, the second dielectric layer 136 has a rectangular aperture that leaves exposed a portion of the patterned metal layer 118 that defines a power ring 118a and bond fingers terminating at or near power ring 118a. The power ring 118a and bond fingers 118e will be described in greater detail with reference to FIG. 3B below.

In this embodiment, the flex tape interconnect substrate 150 is designed to have a larger rectangular aperture 154 surrounding a rectangular cavity opening 166b defined by the ground plane 160. In this manner, a ground ring 164 may be conductively plated directly onto the ground plane 160 (e.g., silver plated) to provide a ground source for the die 112. Most importantly, it should be appreciated that the ground plane 160 acts as a functional layer that may be used to provide a ground source to selected solder balls 120a throughout the package 100. The ground plane 160 therefore provides an active, current carrying layer for all ground connections without the need for a costly second metal layer in the flex tape interconnect substrate 150. By way of example, a ground connection may be made from any solder ball by defining a via 119 through the flex tape interconnect substrate 150 where the ground plane is preferably preplated with a silver plating 162. In a further embodiment, the vias 119 may be pre-filled with a solder paste to avoid having the solder balls 120a seep down into the vias 119. As a result, a more uniform solder ball 120 layout is advantageously achieved.

The semiconductor die 112 bond pads can be wire bonded to any one or more of the bond fingers 118e, power ring 118a, ground ring 164 or signal lines. As shown, an exemplary bond wire 123 is coupled to a signal line, an exemplary bond wire 126' is coupled to power ring 118a, and an exemplary bond wire 126" is coupled to the ground ring 164. Once the die 112 is appropriately interconnected, the cavity is filled with an encapsulation material 122 to protect the die and the wire bonds from the environment and provide suitable mechanical protection. Because some wire bonds are coupled to the top surface of the flex tape interconnect substrate 150, it is preferable that the encapsulation material 122 extends over the flex tape interconnect substrate 150 about 0.20 mm. Although any suitable encapsulation technique may be used, dam forming and encapsulation fill techniques work particularly well. For example, a dam is first formed around the outline of the encapsulation by dispensing a high viscosity version of the encapsulation material 122 and then subsequently filling the cavity with a less viscous version of the same encapsulation material 122.

The ball grid array package 100 of FIG. 3A therefore provides numerous advantages over prior art packages. By way of example, the package 100 in accordance with one embodiment of the present invention provides substantially improved heat dissipation, improved electrical performance and reliability. Furthermore, the package 100 is substantially thinner, lighter and much less expensive to manufacture that the prior art designs.

Further, the layered structure of the cavity having the pliable adhesive 127 provides for independent thermal expansion between the heat spreader 110 and the ground plane 160. As a result, a difference in temperature between the two parts results in significantly less bowing of the heat spreader 110 and therefore less stress on the semiconductor die 112 and less delamination from the cavity. Of course, less delamination always results in better package reliability.

As a further advantage, the layered structure of the package 100 enables the use of thin copper sheets for the construction of the heat spreader 110, and the ground plane 160. In addition, the flex tape interconnect substrate 150 is well suited for making a thin BGA package that is very light weight. This is a desirable advantage in smaller new generation semiconductor devices that require a compact package and run at higher frequencies, thereby benefiting from the substantially improved heat dissipation.

Figure 2:
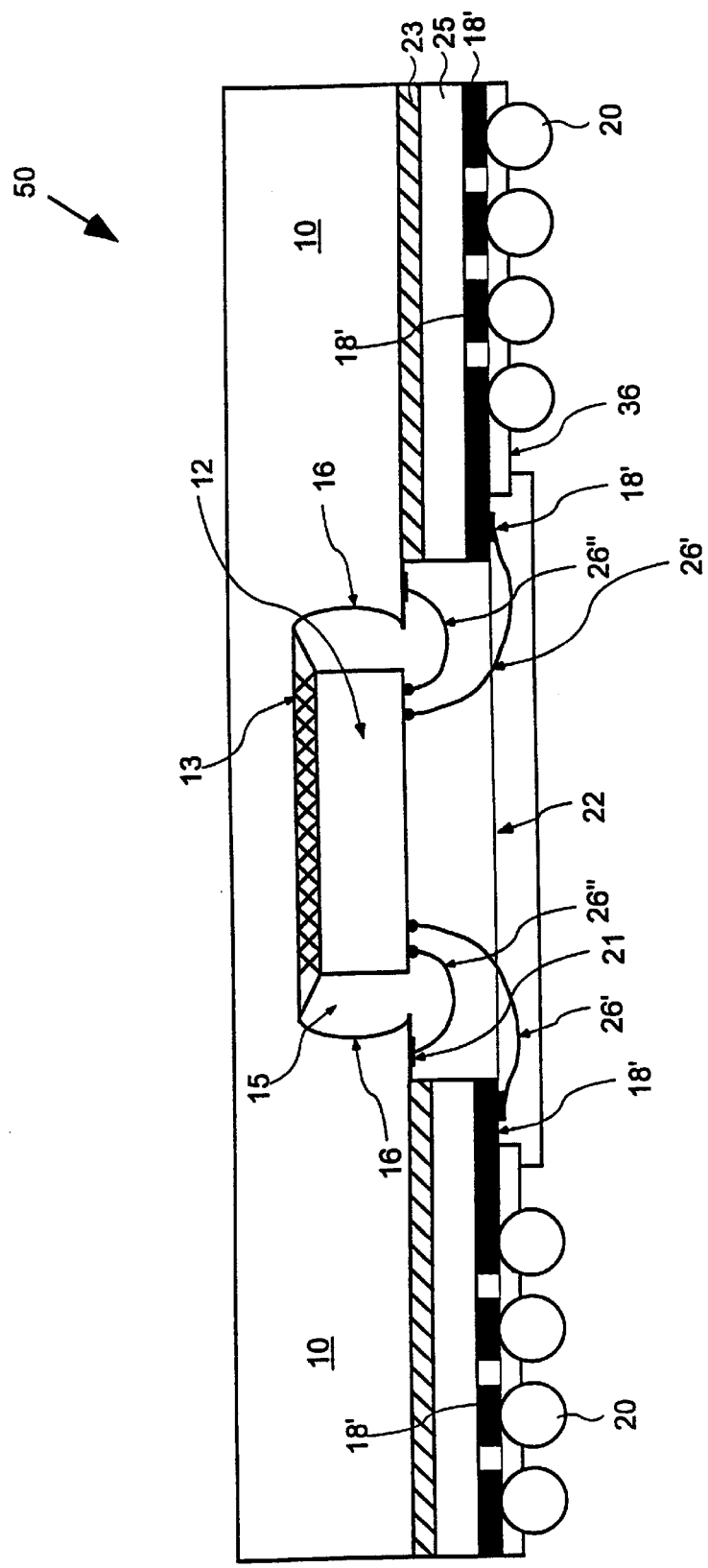
FIG. 2 is a cross sectional view of another prior art ball grid array having an etched cavity heat spreader and a metal layer flex tape interconnect substrate wire bonded to a semiconductor die.

The manufacturing cost is also reduced because the package is only a one-metal layer 118 flex tape interconnect substrate 150 that is formed by existing well known mechanical stamping. As mentioned earlier, the heat spreader 110 and ground plane 160 are also mechanically stamped, thereby eliminating the need for more expensive etching techniques used in the example of FIG. 2. Furthermore, the heat spreader 110 is generic to the package body size and therefore does not need special tailoring to the semiconductor die 112 size nor specific electrical connections.

Figure 3B:
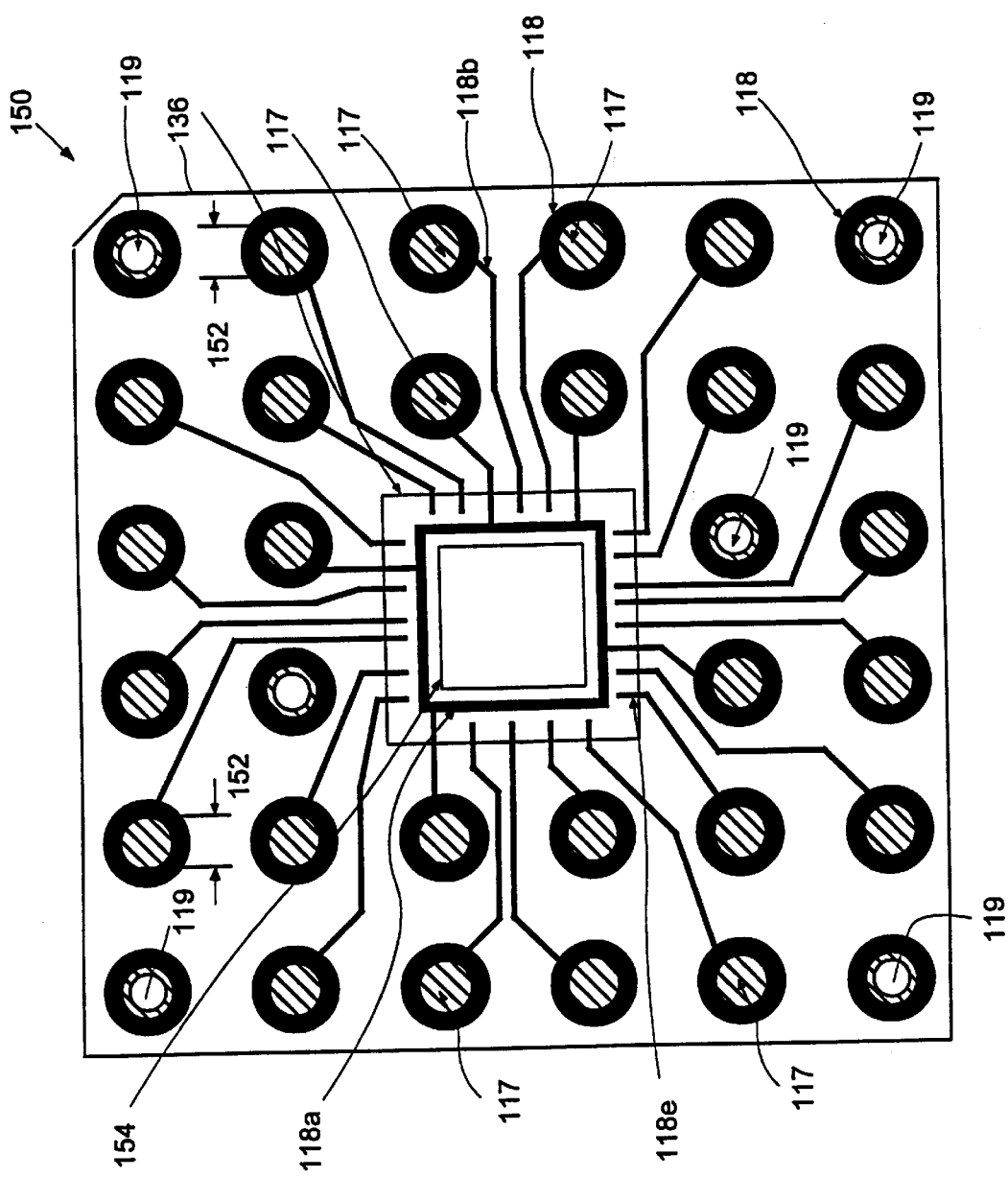
FIG. 3B is a bottom view of the flex tape interconnect substrate with one metal layer, two dielectric layers, an adhesive layer, ground vias, ball pads, power ring, bonding fingers and the device aperture in accordance with one preferred embodiment of the invention.

FIG. 3B is a bottom view of the flex tape interconnect substrate 150 in accordance with one embodiment of the present invention. This view illustrates a plurality of circular metal ball pads 117 defined through the pad openings 152 in the second dielectric layer 136. In one embodiment, the underlying metal ball pads 117 are patterned from the metal layer 118 as described above, and the pad openings 152 are about the same diameter as the solder balls 120 or slightly smaller. As mentioned above, the flex tape interconnect substrate 150 has a centrally designed rectangular aperture 154 that is preferably aligned, but larger than the rectangular cavity opening 166b defined by the ground plane 160. As such, the silver plated ground ring 164 (of FIGS. 3A and 3E) is left exposed for bond wire interconnection.

This view also shows a plurality of conductive metal traces 118b coupled to the metal ball pads 117 and ending in bond fingers 118e near the cavity periphery. Also shown is the power ring 118a that is between about 0.4 mm and 0.5 mm wide. In some cases, the metal traces 118b may be connected to the power ring 118a, and in other cases, the metal traces 118b may end short of the power ring 118a, thereby defining the bond fingers 118e. In one embodiment, all exposed portions of metal layer 118 (i.e., not covered by the second dielectric layer 136), which may include the metal ball pads 117, the power ring 118a and the bond fingers 118e are plated with nickel having a typical thickness of between about 1 micron and about 2 microns, or gold plated with a thickness of about 0.5 microns.

As described above, the underlying ground plane is used as a functional current carrying surface, and therefore, any number of vias 119 may be provided for subsequently formed solder balls 120a. As such, when a via 119 is provided through the flex tape interconnect substrate 150, no additional metal traces 118b will be required for those solder ball contacts. Accordingly, it is possible to package high performance dies 112 in package 100 without having to use expensive flex tape interconnect substrates having more than one metal.

An advantage of the present embodiment is that the routing density of the flex tape interconnect substrate 150 may be increased due to the implementation of the current carrying ground plane 160. For example, the flex tape interconnect substrate 150 may be designed to the highest density levels at the corners of the package, where more solder balls 120 from the outer rows have to be routed to the central area. This density generally determines the number of solder balls 120 that may be fully routed on each metal layer 118. Therefore, by using about 38 micron wide metal traces 118b, up to about five rows of solder balls 120 having about 1.27 mm pitch can be routed in one metal layer 118. For comparison purposes, the ground connections in conventional BGA packages to a typical die take up to about 15% or more of the total solder ball count. However, designs in accordance with the present invention make all the ground connections between the die 112 and the solder balls 120a through the ground plane 160. Therefore, if a fraction of the corner area solder balls 120a are allocated for ground connections, then a sixth inner row may be routed to increase the solder ball 120 count of the package 100. In this manner, signal routing may be increased without increasing the package size.

Figure 3C:
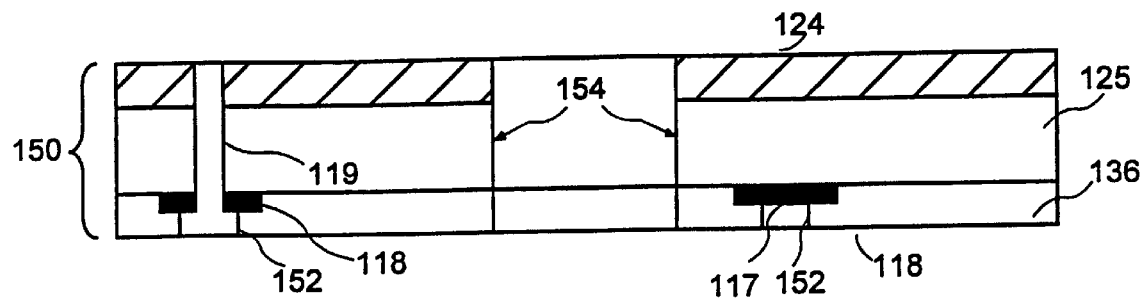
FIG. 3C is a cross sectional view of the flex tape interconnect substrate with the first adhesive, one metal layer and two dielectric layers in accordance with one preferred embodiment of the invention.

FIG. 3C is a magnified cross sectional view of a flex tape interconnect substrate 150 in accordance with one embodiment of the present invention. This magnified view, shows the adhesive layer 124 attached to one side of the first dielectric layer 125. In one embodiment, the adhesive layer 124 has a thickness of about 50 microns, and is laminated onto the first dielectric layer 125. The first dielectric layer 125 is preferably a polyimide material having a thickness of about 75 microns, and is attached to the patterned metal layer 118. The metal layer 118 will preferably have a thickness of about 20 microns, plus an additional thickness of at least about 2 microns and about 0.5 microns for nickel and gold, respectively. As mentioned earlier, the patterned metal layer 118 is selectively covered with the second dielectric layer 136 that is typically a solder mask having a thickness of about 25 microns.

FIG. 3C also provides a clear cross sectional view of a via 119 that can be used to interconnect down to a current carrying ground plane 160 (of FIG. 3A). As mentioned earlier, pad openings 152 are defined in the second dielectric layer 136 to define a path down to the metal ball pads 117 of the patterned metal layer 118 and vias 119. It is particularly important to understand that the via holes 119, and the rectangular aperture 154 defined in the flex tape interconnect substrate 150 are swiftly punched through all at one time by a mechanical punch.

Figure 3D:
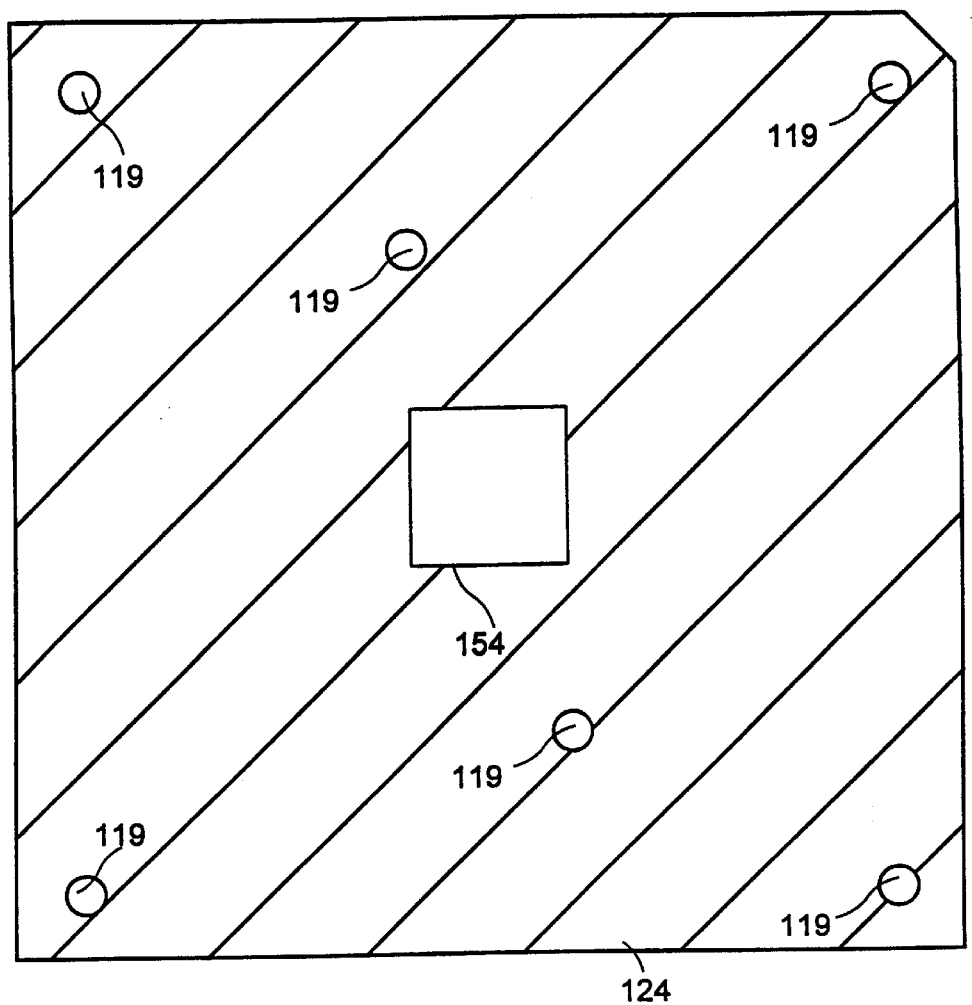
FIG. 3D is a top view of the flex tape interconnect substrate with the tape adhesive, ground vias and a device aperture in accordance with one preferred embodiment of the invention.

FIG. 3D illustrates the flex tape interconnect substrate 150 viewed from the adhesive layer 124 side after being punched through with a mechanical punch in accordance with one embodiment of the present invention. As mentioned above, the adhesive layer 124 is used to attach the flex tape interconnect substrate 150 to the ground plane 160. Preferably, the adhesive layer 124 is a pressure sensitive adhesive that may be obtained from 3M Corporation of Minnesota. In this embodiment, a plurality of via holes 119 may be defined to have a diameter that is about 0.1 mm less than the pad openings 152. Further, the diameter of the silver plating 162 provided on the ground plane 160 is also about 0.1 mm less than the pad openings 152. The rectangular aperture 154 is preferably aligned with, and is about 1 mm larger than the cavity opening 166a defined in the flex tape interconnect substrate 150.

Figure 3E:
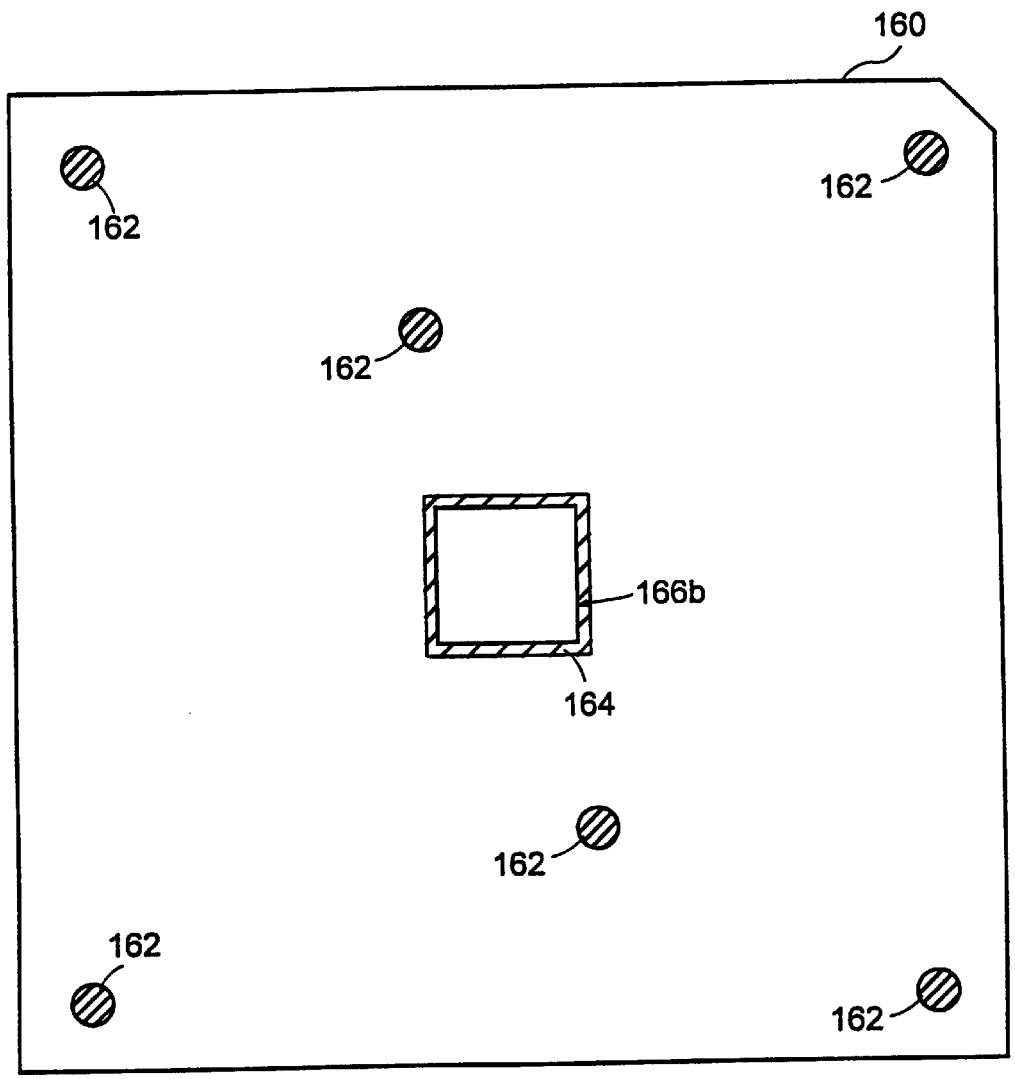
FIG. 3E is a view of the second surface of the ground plane having a silver plated ground ring, silver plated pads and a device aperture in accordance with one preferred embodiment of the invention.

FIG. 3E is a view of the ground plane 160 that is configured to be attached to the adhesive layer 124 of the flex tape interconnect substrate 150 in accordance with one embodiment of the present invention. The ground plane 160 is preferably made of a clean copper material that is selectively plated with silver (or any other suitable conductive plating) at predetermined locations to form circular silver plated pads 162 having a diameter of between about 0.30 mm and about 0.6 mm, and at least one micron thick. These silver plated pads 162 are well suited to provide an electrically conductive and solderable surface on ground plane 160 for which a ground connection is made to selected solder balls 120a.

By way of example, vias 119 are preferably filled with a conductive solder paste and reflowed to fill the vias 119 with conductive solder such an even surface is made with the metal layer 118 of the flex tape interconnect substrate 150. In this manner, solder balls 120a are advantageously prevented from seeping into vias 119 and thereby producing an uneven solder ball array. This view of the ground plane 160 also shows the silver plated ground ring 164 around a definition of the rectangular cavity opening 166b. Although the entire rectangle defined by the rectangular cavity opening 166b may be plated, because mask plating is used, it is possible to precision plate only those surface areas that benefit from the silver plating. Accordingly, the silver plated ground ring is preferably about 0.50 mm wide, and has a preferred minimum thickness of about 1 micron.

Figure 3F:
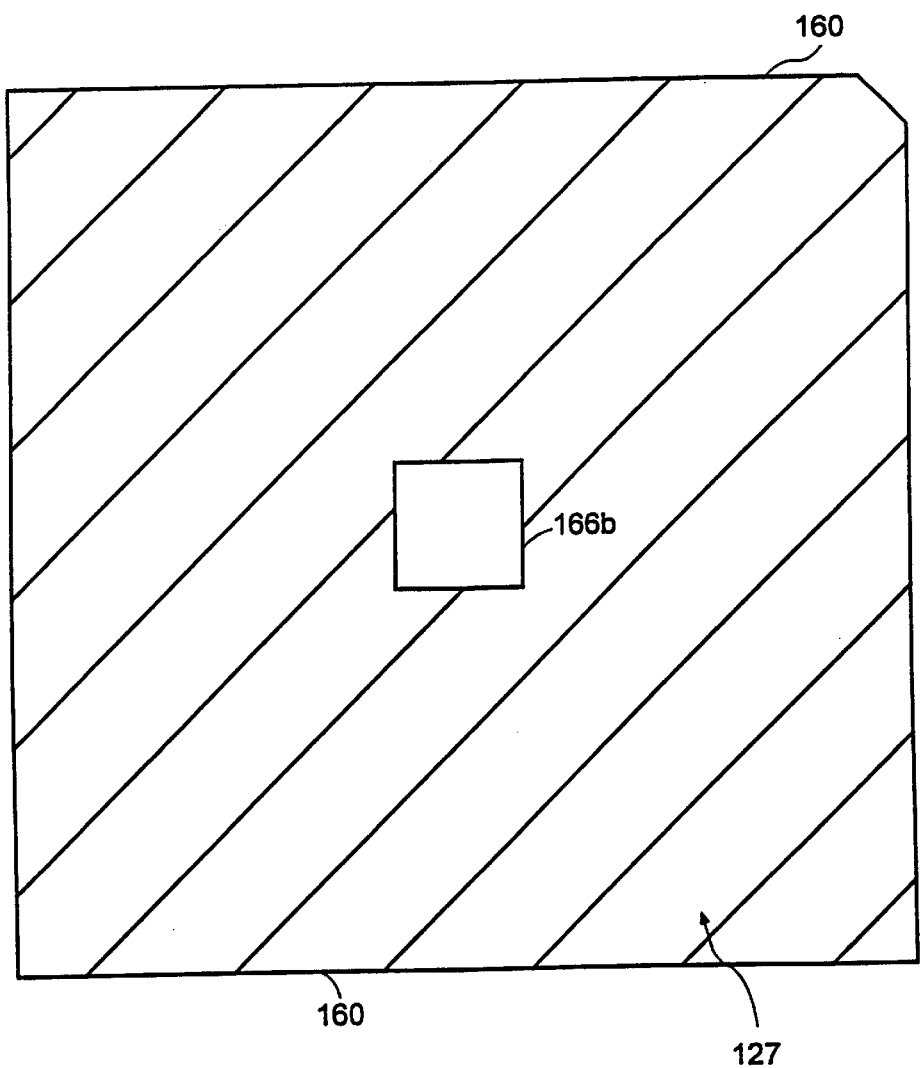
FIG. 3F is a top view of the ground plane with an adhesive layer and a device aperture in accordance with one preferred embodiment of the invention.

FIG. 3F illustrates the ground plane 160 viewed from the adhesive layer 127 that is attached to ground plane 160 in accordance with one embodiment of the present invention. Preferably, the adhesive layer 127 is a double sided adhesive that is first adhered to the ground plane 160 and then subsequently adhered to the heat spreader 110. In this manner, the ground plane 160 is adequately laminated to the heat spreader 110 as shown in FIG. 3A. In one embodiment, the adhesive layer 127 preferably has a thickness of about 50 microns, and can be one of many adhesives established in the industry including pressure sensitive adhesives, epoxies or b-stage epoxies. The pressure sensitive type adhesive can be laminated onto the ground plane 160 at room temperature, and is a preferred adhesive because costly curing steps are not required. The ground plane 160 shows the cavity opening 166b in a central location, and is usually about 1.0 mm larger than the semiconductor die 112.

Figure 3G:
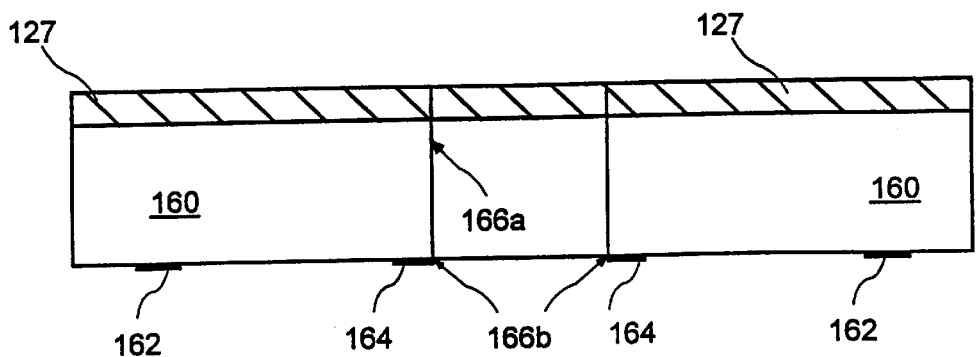
FIG. 3G is a cross sectional view of the ground plane having an adhesive layer, silver plated ground ball pads and ground ring, and the device aperture in accordance with one preferred embodiment of the invention.

FIG. 3G is a cross sectional view of the ground plane 160 having a centrally located cavity opening 166b that is preferably stamped-out along with the adhesive layer 127 in accordance with one embodiment of the present invention. The ground plane 160 is preferably a copper sheet having a thickness of about 0.45 mm for BGA packages being about 1.4 mm in thickness. For BGA packages having a thickness of about 1.0 mm or thinner, the ground plane 160 is preferably about 0.2 mm thick. In a preferred embodiment, the ground plane surface 160 covered with the adhesive layer 127 is preferably a copper oxide surface that is well suited to promote adhesion and reduce delamination from the bottom of the cavity. This view also shows the silver plated pads 162 and the ground ring 164 that is defined around the cavity opening 166b.

As mentioned above, the ground plane 160 provides a current carrying plane for all ground connections, while the metal layer 118 of the flex tape interconnect substrate 150 is used for all the signal and power connections. As such, the ground plane 160 advantageously replaces the need for a second metal layer on the flex tape interconnect substrate 150. A significant advantage is that higher performance semiconductor dies 112 may be packaged in BGA package 100 at substantially lower packaging costs than other packages implementing expensive multi-metal interconnect substrates.

Further yet, the ground plane 160 provides an electrical shield against unwanted electro-magnetic radiation to and from the semiconductor die 112. This is particularly important in high frequency electronic devices having close spacings between components, as well as telecommunication products having strict emissions regulations. As such, the layered structure of the formed cavity provides a good mechanical locking surface for the encapsulation compound, thus reducing delamination from the walls 166a.

Figure 3H:
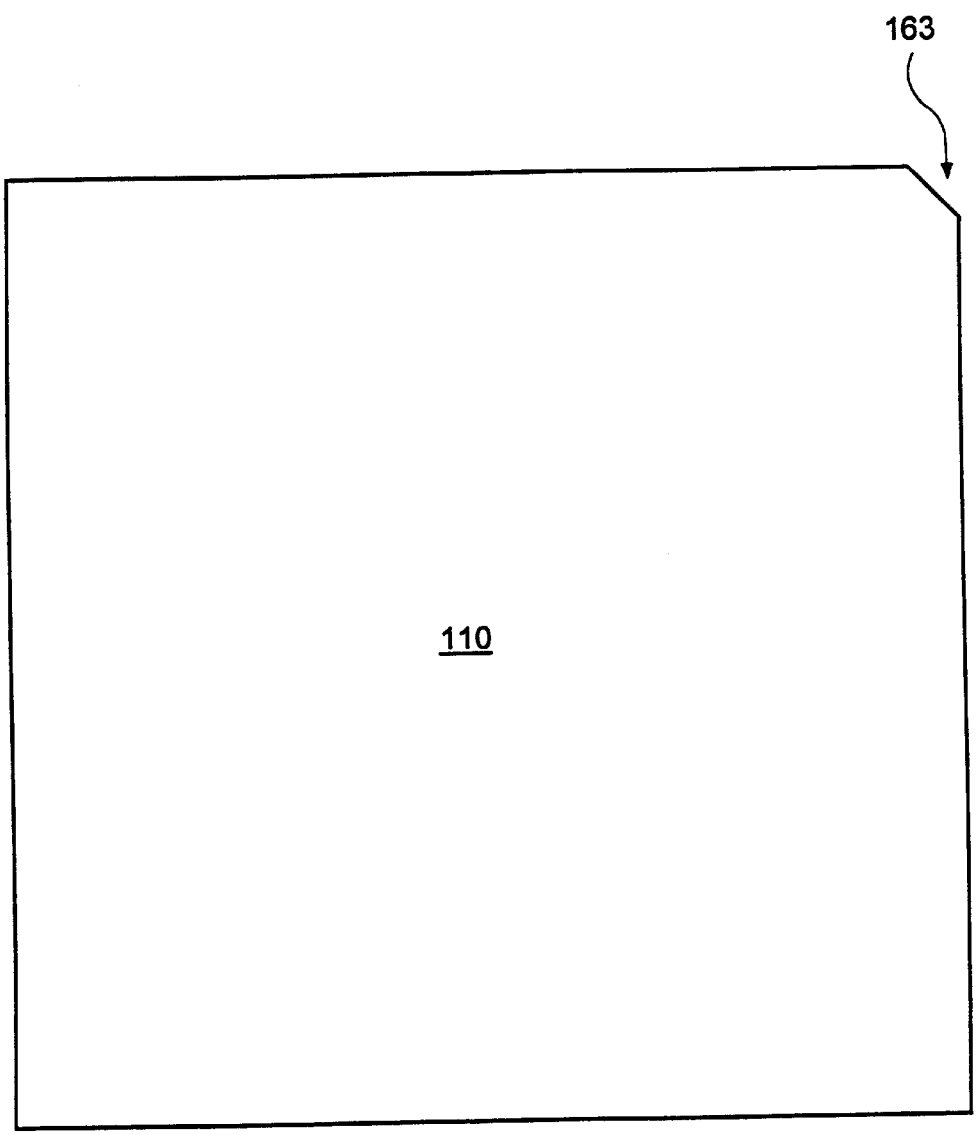
FIG. 3H is a top view of a heat spreader plate in accordance with one preferred embodiment of the invention.

FIG. 3H is the top view of the heat spreader 110 having a chamfer 163 at the upper right corner to indicate the location of the number one solder ball 120. The heat spreader 110 is preferably a copper sheet having a thickness of between about 0.15 mm and about 0.80 mm, and is configured to cover the entire top surface of the package 100. For a 1.4 mm thick ball grid array "BGA" package, the heat spreader 110 thickness is preferably about 0.25 mm, and for a 1.0 mm thick BGA package, the heat spreader 110 has a thickness of about 0.15 mm. In one embodiment, the heat spreader 110 material is preferably a 99.9% pure hard copper (Cu) such as cop Olin copper 151 made by Olin Brass Co. of Rochester Hills, Mich. The hard copper material is preferred because it provides good planarity for the package 100.

Both surfaces can be treated to include between about 1 micron and about 7 microns of black copper oxide to improve the adhesion to both the die attach adhesive 113 and the adhesive layer 127. Alternatively, either surface can be plated with metals such as nickel to provide an electrically conductive surface. The design and construction of the heat spreader 110 can be generic to the package body size and can be substantially the same for the alternative embodiments of the present invention. It is further noted that the heat spreader 110 can be made out of other thermal conductors that have a thermal expansion coefficient closer to that of silicon at 3 ppm/C, including a copper/tungsten/copper laminate, a copper/molybdenum/copper laminate or aluminum nitride.

In one embodiment, heat spreader 110 of the present invention accounts for about 50% of the heat transferred from the semiconductor die 112 to the ambient air. The remaining about 50% is thus conducted through a second path including the adhesive layer 127, the thermally conductive ground plane 160 and the flex tape interconnect substrate 150. From the flex tape interconnect substrate 150, the heat is then transferred to the solder balls which are in contact with a mother board (not shown) onto which the package 100 is attached. The thermal conductivity of the second path includes about 125 microns of dielectric layers including adhesive layer 127, adhesive layer 124 and first dielectric layer 125, and about 450 microns of copper associated with the ground plane 160. Because there is a higher percentage metal (i.e., ground plane 160) within this second path, the heat is allowed to more efficiently be transferred to the mother board.

Figure 1:
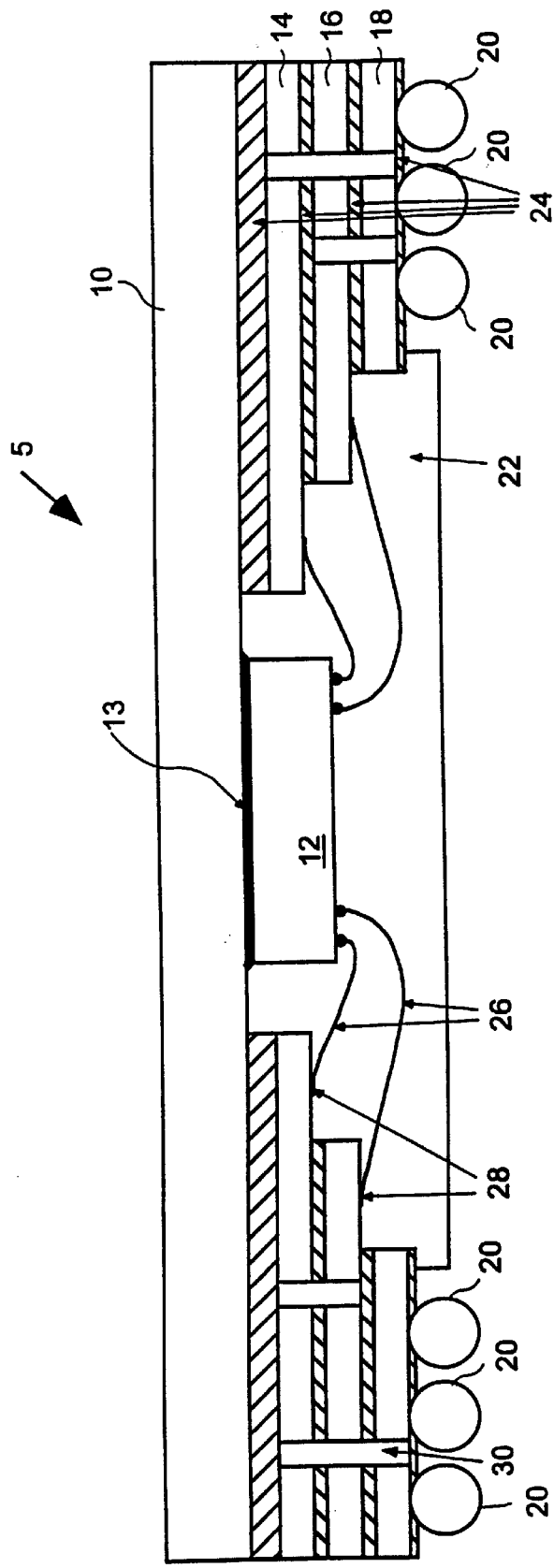
FIG. 1 is a cross-sectional view of a prior art ball grid array package having a heat spreader and multi-layer PCB interconnect substrate wire bonded to a semiconductor die.

In contrast, the prior art BGA shown in FIG. 1 has a 0.7 mm thick PCB interconnect substrate with no significant metal content, thereby providing an inefficient thermal path. For comparison purposes, the thermal resistance of a 27 mm×27 mm BGA package 100 according to one embodiment of this invention was measured to be about 18 C/Watt, while the thermal resistance of a similarly size PCB package was about 23 C/Watt. As will be appreciated by those skilled in the art, the improved heat dissipation of the present invention is a significant advancement in the packaging arts.

Figure 4:
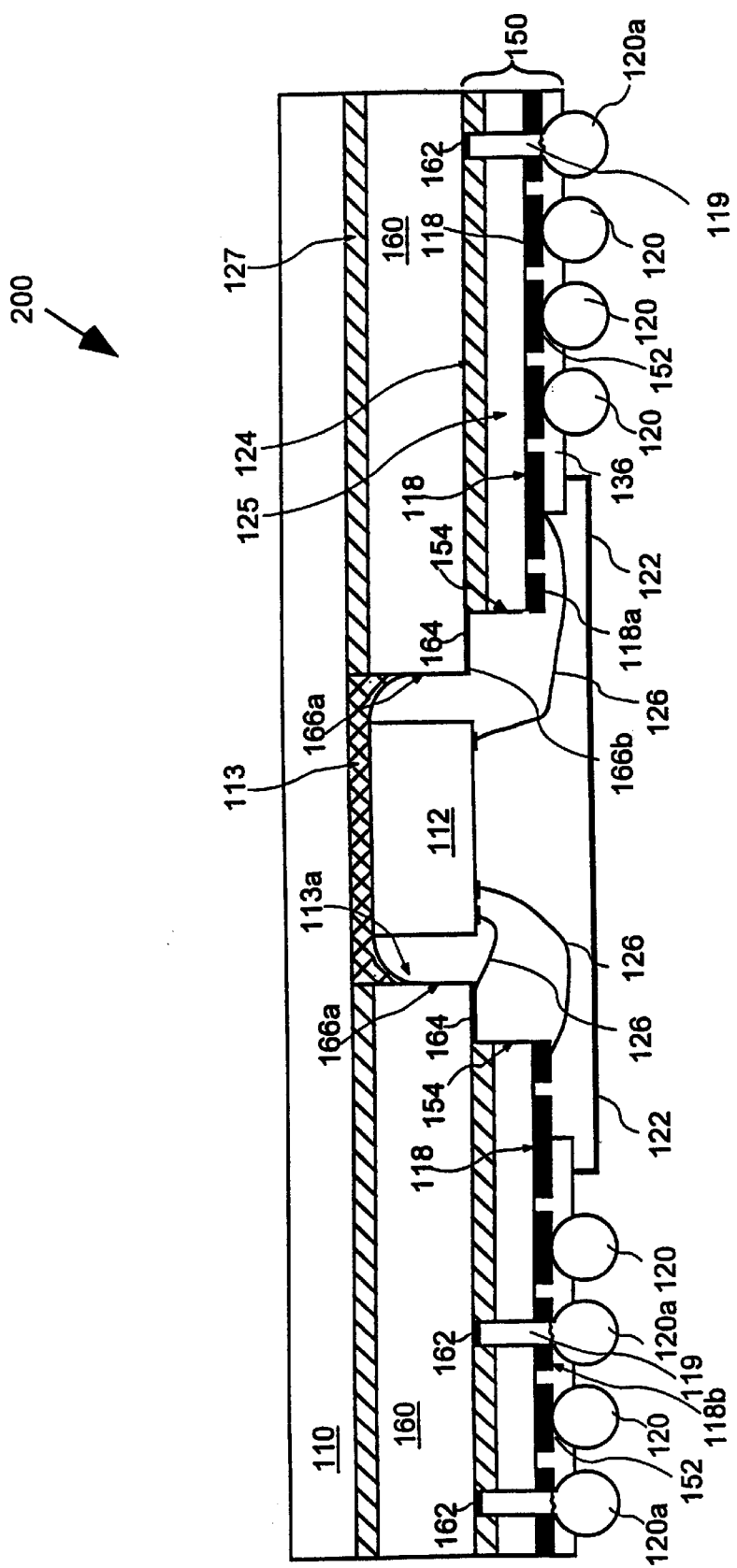
FIG. 4 is a cross sectional view of a ball grid array with a heat spreader and ground plane, flex tape interconnect substrate and a lid in accordance with an alternative embodiment of the present invention.

FIG. 4 is a cross sectional view of a ball grid array (BGA) 200 according to a second embodiment of the present invention. In this embodiment, a lid 222 is used to cover the die 112 and bond wires 126. The lid 222 can be attached to the substrate with any number of well known adhesives, thereby leaving an empty cavity (i.e., with no encapsulation material). This construction provides sufficient expansion space in case vaporized moisture is produced within the cavity during the aforementioned reflow temperatures that reach about 220 C. As an advantage, the lid 222 is well suited to prevent the possibility of die 112 delamination from the die attach epoxy 113, and of course reduce the possibility of the "popcorning" effect most prevalent in encapsulation materials. In one embodiment, the lid can be made out of an oxidized copper sheet having a thickness of about 0.20 mm, such that sufficient mechanical strength is provided to prevent bond wires 126 from shorting with the lid 222.

As mentioned earlier, the solder balls 120 and 120a are generally attached to the flex tape interconnect substrate 150 via well known reflow techniques and have a preferred composition of about 67% tin and about 23% lead. As described with reference to FIG. 3A above, solder balls 120a are preferably in electrical contact with the ground plane 160 through conductively filled vias 119. Further, the gold plated ball pads 117 and the silver plated pads 162 on the ground plane 160 provide good wetable surfaces onto which solder may form reliable joints.

Figure 5A:
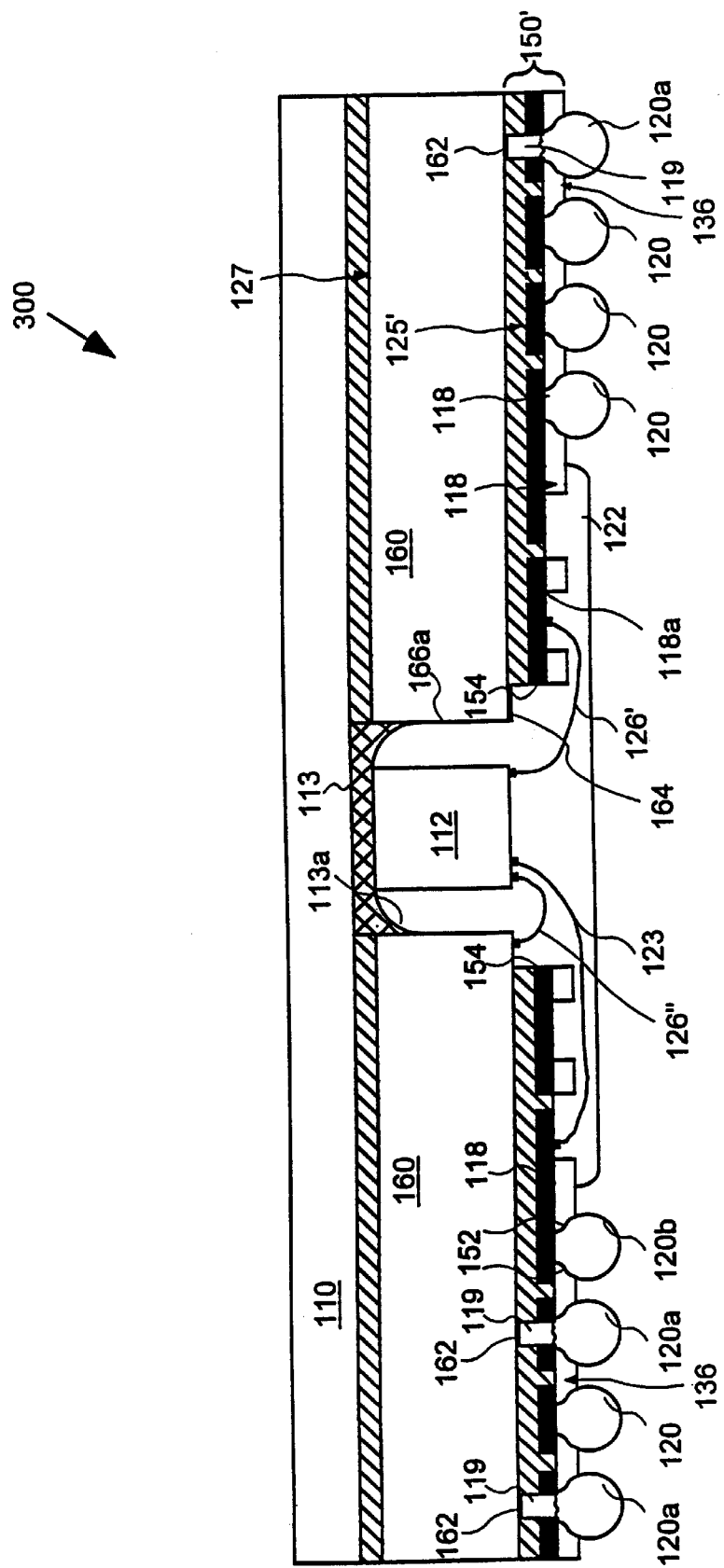
FIG. 5A is a cross sectional view of a ball grid array package with a heat spreader and ground plane using a flex tape interconnect substrate with one metal, one dielectric and one dielectric/adhesive layer in accordance with an alternative embodiment of the present invention.

FIG. 5A is a cross section of a third embodiment of the present invention using a flex tape interconnect substrate 150' having one metal layer 118, a first dielectric layer 125' and second dielectric layer 136. In this embodiment, the first dielectric layer 125' is preferably an adhesive that is used to attached to the ground plane 160 to the flex tape interconnect substrate 150'. Apart from the flex tape interconnect substrate 150', the ball grid array BGA package 300 of this embodiment is substantially the same as the previous embodiments. Further, BGA package 300 has substantially the same advantages over the prior art packages as the previous embodiments of this invention. However, it is noted that this flex tape interconnect substrate 150' is slightly less expensive that the flex tape interconnect substrate 150' of FIG. 3B.

Figure 5B:
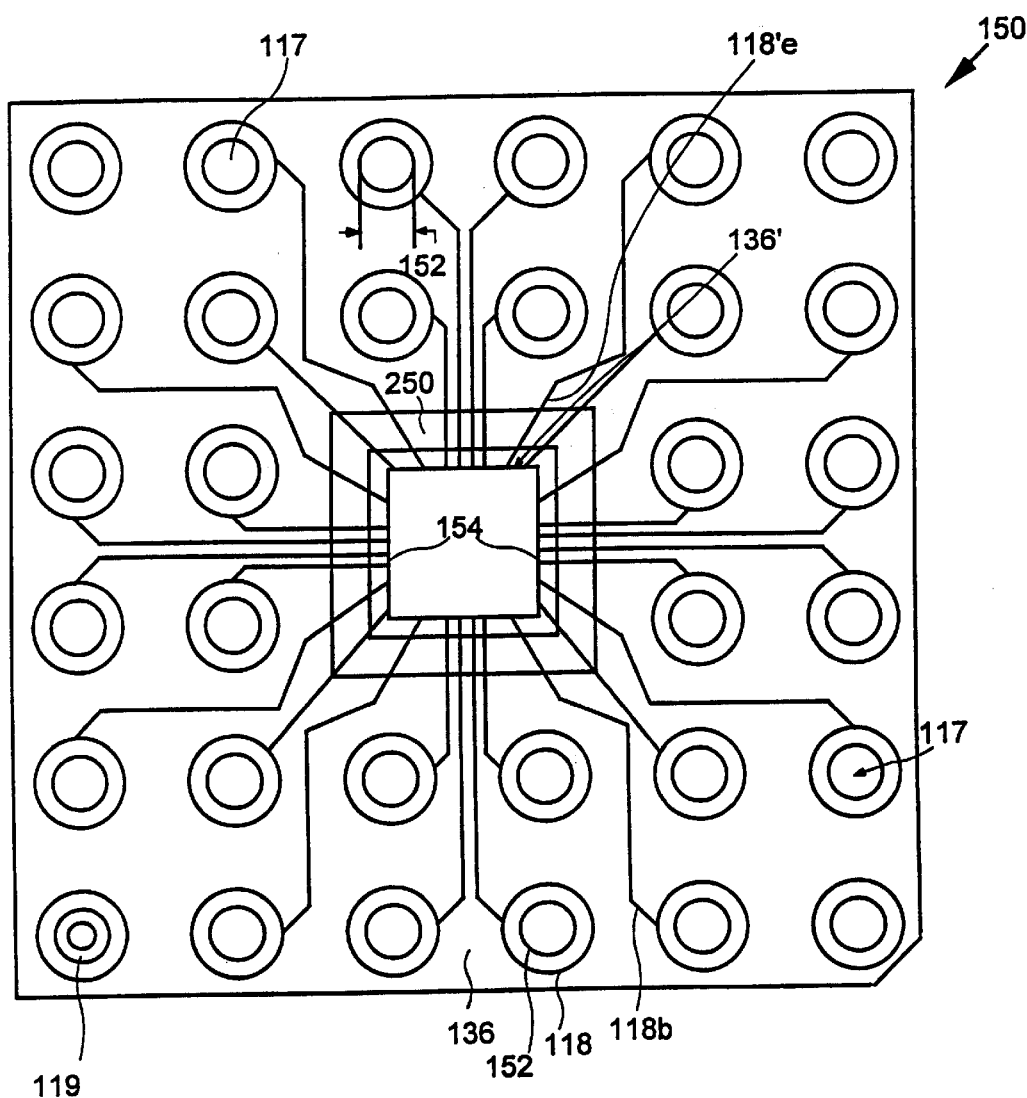
FIG. 5B is a top view of the flex tape interconnect substrate with one metal, one dielectric layer, ground ball apertures, bond finger aperture and the device aperture in accordance with an alternative embodiment of the present invention.

FIG. 5B is a top view of the flex tape interconnect substrate 150' having a metal layer 118 in accordance with the third embodiment of the present invention. The ball pads 117 are shown connected to a plurality of bond fingers 118e' of the metal layer 118. The dimensions of ball pads 117 defined in pad openings 152, the rectangular aperture 154 and ground ball pad vias are substantially the same as those described with reference to FIGS. 3A through 3H. The metal layer is similarly plated with nickel/gold with a minimum thickness of about 2 microns and about 0.5 microns, respectively.

The bonding fingers 118e' on the flex tape interconnect substrate 150' are supported by the first dielectric layer 125' as shown in FIG. 5A. However, caution should be exercised to ensure that during the application of this first dielectric layer 125', the adhesiveness of this dielectric layer does not contaminate the gold plated bonding fingers 118e' such that good and reliable wire bonding is maintained. Also shown is a moat aperture 250 defining a path down to bonding fingers 118e'. As such, a second dielectric keeper ring 136' is defined around the moat aperture 250.

Figure 5C:
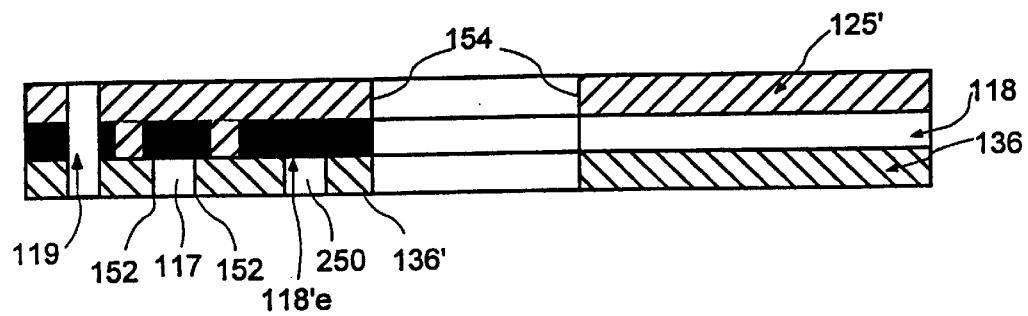
FIG. 5C is a cross sectional view of the flex tape interconnect substrate of FIGS. 5A and 5B in accordance with an alternative embodiment of the present invention.

FIG. 5C is a cross section of the flex tape interconnect substrate 150' in accordance with one embodiment of the present invention. The first dielectric 125' completely covers the metal layer 118 and forms a surface of the flex tape interconnect substrate 150'. The second dielectric layer 136 is usually a polyimide having a preferred thickness of about 50 microns. As shown, the second dielectric layer 136 may have a number of circular apertures that expose the ball pads 117 on the metal layer 118 and the aforementioned bonding fingers 118e' that are exposed through the moat aperture 250.

The flex tape interconnect substrate 150' has circular apertures 152 concentric to the silver plated ground pads 162 on the ground plane 160, and substantially the same diameter as the ball pad apertures 152 on the dielectric layer 136. The flex tape interconnect substrate 150' preferably includes a rectangular aperture 154 that is concentric to the device aperture 166b of the ground plane 160, but larger by about 1.0 mm. Of course, the flex tape interconnect substrate 150' can include more than one layer pairs of metal 118 and dielectrics for routing additional power and ground planes through solder balls 120.

Figure 6A:
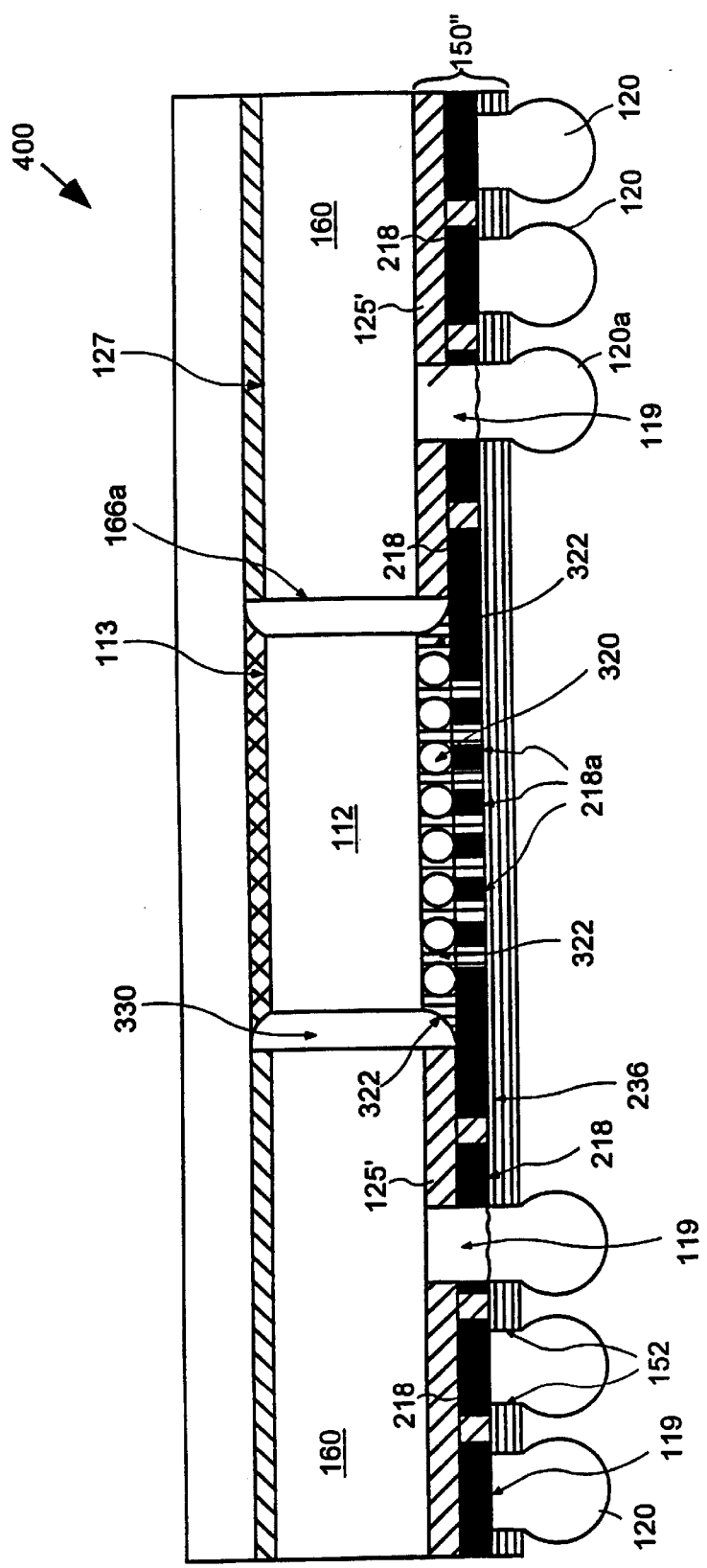
FIG. 6A is a cross sectional view of a ball grid array package with heat spreader and ground plane, flex tape interconnect substrate connected to the semiconductor die with solder bumps in accordance with an alternative embodiment of the present invention.

FIG. 6A shows a cross section of a BGA package 400 in accordance with a fourth embodiment of the present invention where the semiconductor die 112 is connected to the flex tape interconnect substrate 150" via solder bumps 320. As in the embodiment of FIG. 5A, the first dielectric layer 125' is an adhesive layer that is well suited to attach the flex tape interconnect substrate 150" to the ground plane 160. The solder bumps 320 are reflowed onto bump pads 218a of the metal layer 218 to form an electrical and metallurgical bond to the metal layer 218. The space between the flex tape interconnect substrate 150" and the die 112 is preferably filled with an underfill epoxy 322 in order to protect the interconnect surface of the die 112 and solder bumps 320, and to provide good mechanical strength. Otherwise this embodiment is substantially the same as the previous embodiment of this invention. However, one particularly advantageous feature of this embodiment is the use of a one metal layer 118 flex tape interconnect substrate 150" to connect the solder bumps 320 to the bump pads 218a. Otherwise, this embodiment has substantially the same or more advantages as those described above.

Figure 6B:
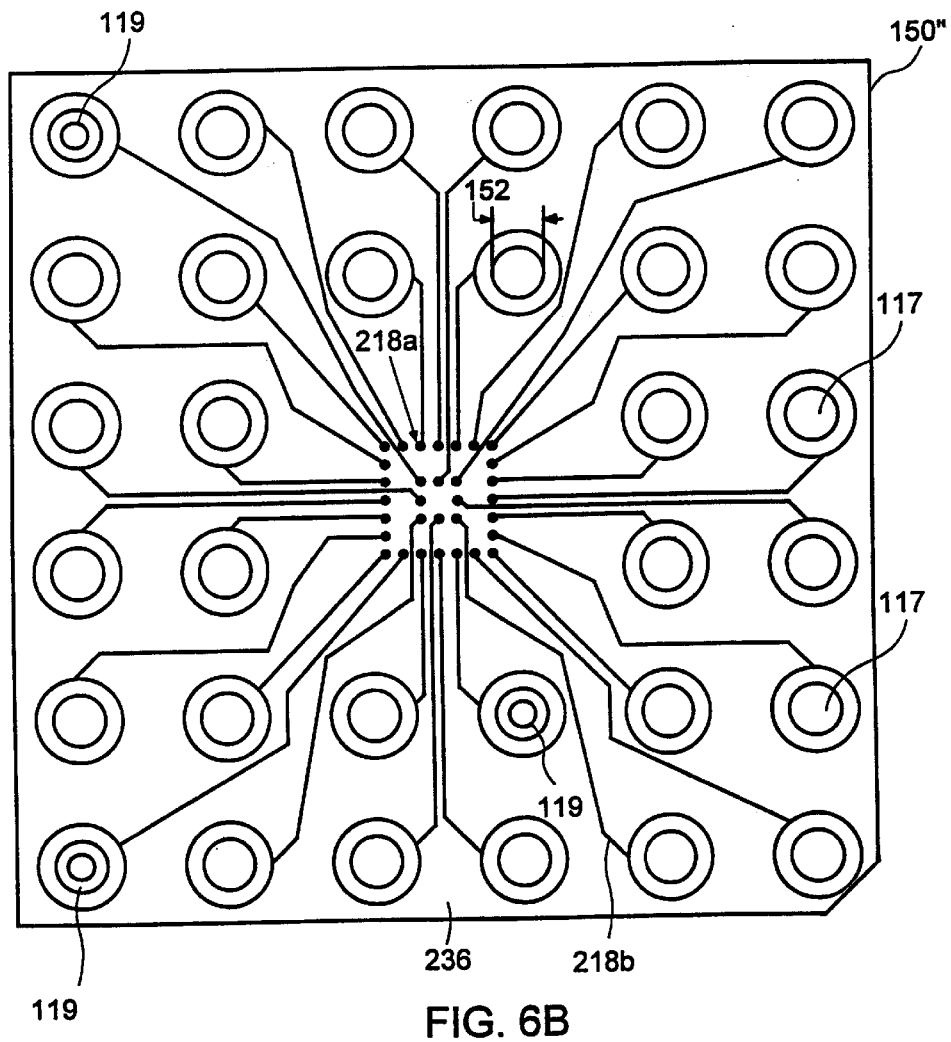
FIG. 6B is the top view of the flex tape interconnect substrate with one metal, one dielectric layer and bump pads for flip chip attachment to a semiconductor die in accordance with an alternative embodiment of the present invention.

FIG. 6B is a top view of the flex tape interconnect substrate 150" having metal layer 118 routed between circular metal ball pads 117 via a number of metal traces 218b. The bump pads 218a in the central area are preferably plated with nickel and gold as in the previous embodiments. An important advantage of this embodiment is the use of a one-metal layer flex tape interconnect substrate 150" to interconnect to the solder bumps 320 on the die 112. The ball grid array in accordance with this embodiment may be assembled in a strip form using equipment and tools well established in the assembly industry of the plastic ball grid arrays.

Figure 6C:
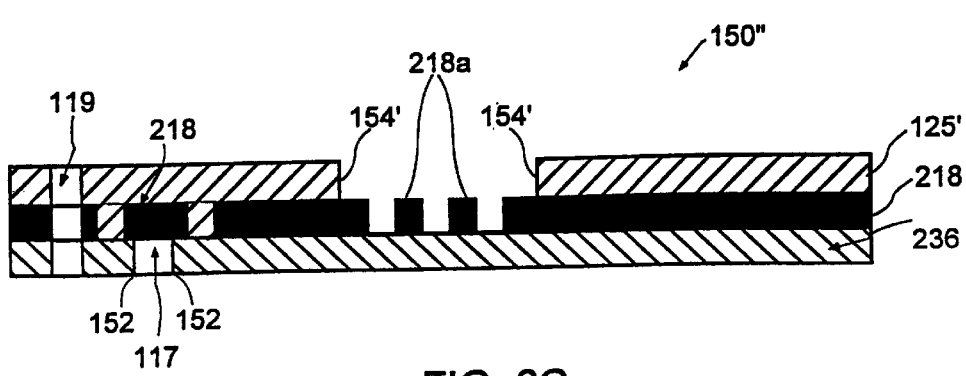
FIG. 6C is a cross sectional view of flex tape interconnect substrate of FIGS. 6A and 6B in accordance with an alternative embodiment of the present invention.

FIG. 6C shows a cross sectional view of the layer flex tape interconnect substrate 150" having one metal layer 218 in accordance with one embodiment of the present invention. As mentioned above, the first dielectric layer 125' is preferably an adhesive that is well suited to adhere to the ground plane 160. This cross section also shows a second dielectric 236' (e.g., a solder mask) that is direct contact with the underlying metal layer 218. Preferably, the first dielectric has a device aperture 154' exposing the bump pads 218a of the metal layer 218. Further, the second dielectric layer 236 has a plurality of openings 154 and vias 119 as in the previous embodiments. It is again pointed out that vias 119 (once filled with a conductive fill) provide the electrical interconnection to the ground plane 160 via solder balls 120a. In this embodiment, both the bump pads 218a and the ball pads 117 are plated with nickel and gold to provide a wetable surface onto which solder adheres well.

II. Methods for Manufacturing the Semiconductor Package Embodiments

Figure 7A:
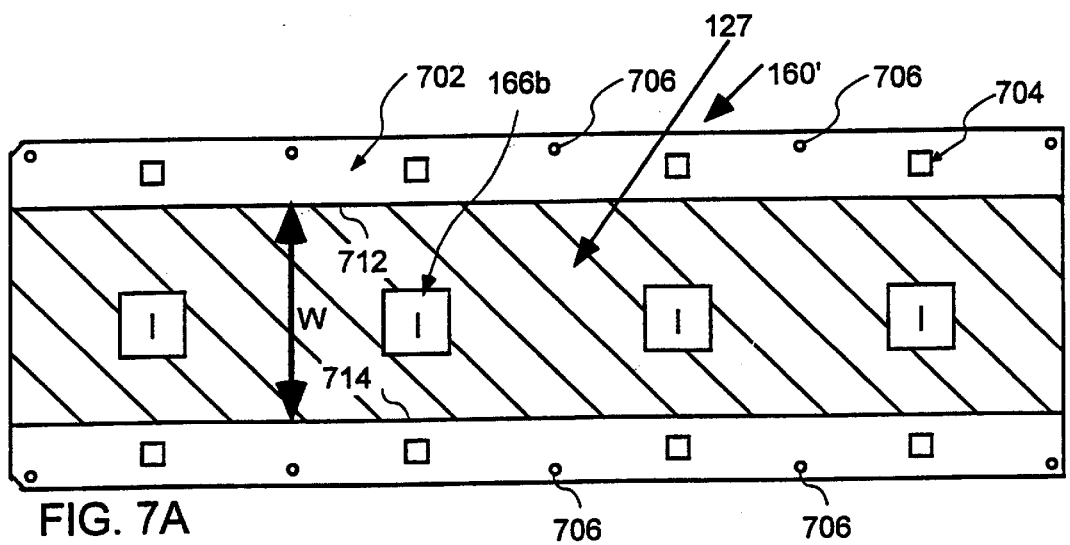
FIG. 7A is a top view of a ground plane strip having the first adhesive used in the assembly process of a ball grid array package in accordance with one embodiment of the present invention.

FIG. 7A shows a top view of a ground plane strip 160' from the adhesive layer 127 side in accordance with one embodiment of the present invention. For fabrication efficiency, the BGA packages of the embodiments described above are fabricated from a sheet of copper 702 defining a plurality of package sites. Although any number package sites may be provided, the present example contains four substantially identical package sites. As shown, ground plane strip 160' has a pair of symmetrically located sprocket holes 704 associated with each package site, and are advantageously used for aligning the flex tape interconnect substrate 150 during the assembly process. Two pairs of tooling holes 706 located at each of the four corners of package site are used by the solder ball placement and package singulation equipment for efficient fabrication. Preferably, the width "w" of the first adhesive is larger than the package body size, but about substantially the same width as the heat spreader 160'.

Figure 7B:
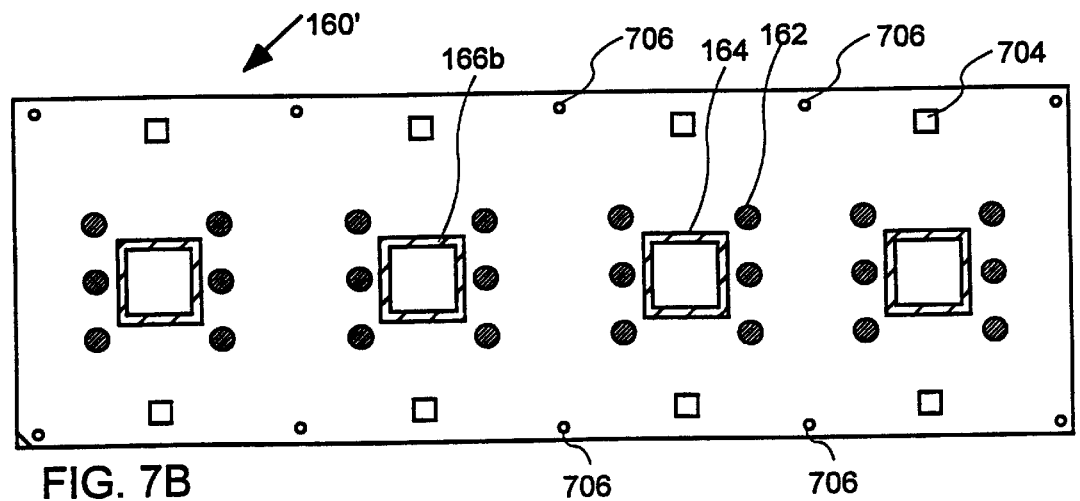
FIG. 7B is a bottom view of the ground plane strip used in the assembly of the ball grid array in accordance with one embodiment of the present invention.

FIG. 7B is a bottom view of the ground plane strip 160' having the silver plated pads 162 and the silver plated ground ring 164 in accordance with one embodiment of the present invention. In fabrication, the rectangular opening 166b is mechanically stamped through the copper strip 702 for all package sites. Accordingly, when the rectangular opening 166b is stamped through, the underlying adhesive 127 is also punched through, thereby producing excellent alignment of the two apertures at a substantially low manufacturing cost.

Figure 7C:
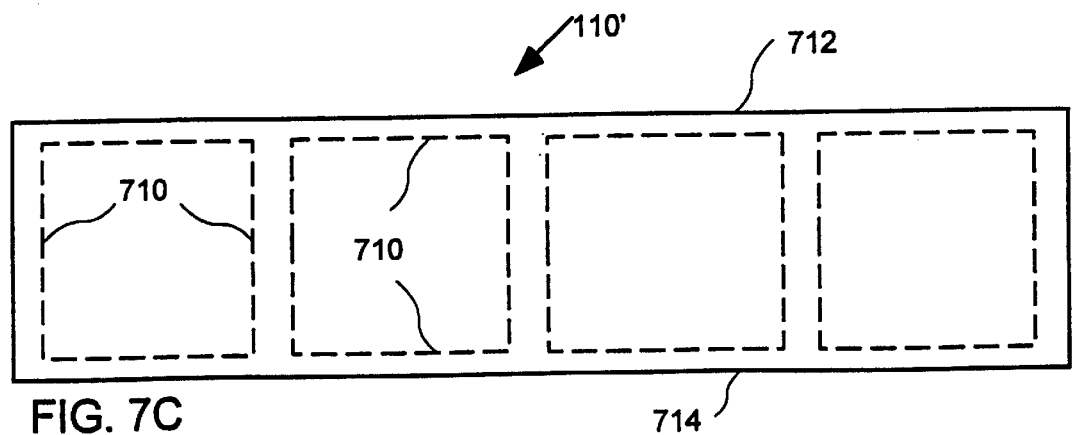
FIG. 7C is a top view of the heat spreader strip in accordance with one embodiment of the present invention.

FIG. 7C shows the heat spreader strip 110' having the same number of package sites as the ground plane strip 160', and also having substantially the same length as the ground plane strip 160'. The heat spreader strip 110' is preferably wider than the package body size 710 and has substantially the same width as the adhesive layer 127 defined by outlines 712 and 714. As mentioned above, the heat spreader strip 110' is a strip of copper preferably having both surfaces treated with black copper oxide to promote adhesion.

Following the fabrication process, the heat spreader strip 110' is then attached to the ground plane strip 160' having the adhesive layer 127. However, caution should be taken during the lamination process to avoid inclusion of air bubbles in the adhesive layer 127 once the heat spreader strip 110' is attached to the ground plane strip 160'. Once assembled, the resulting strip will have a cavity opening 166b formed by the ground plane 160 of each package site.

Figure 7D:
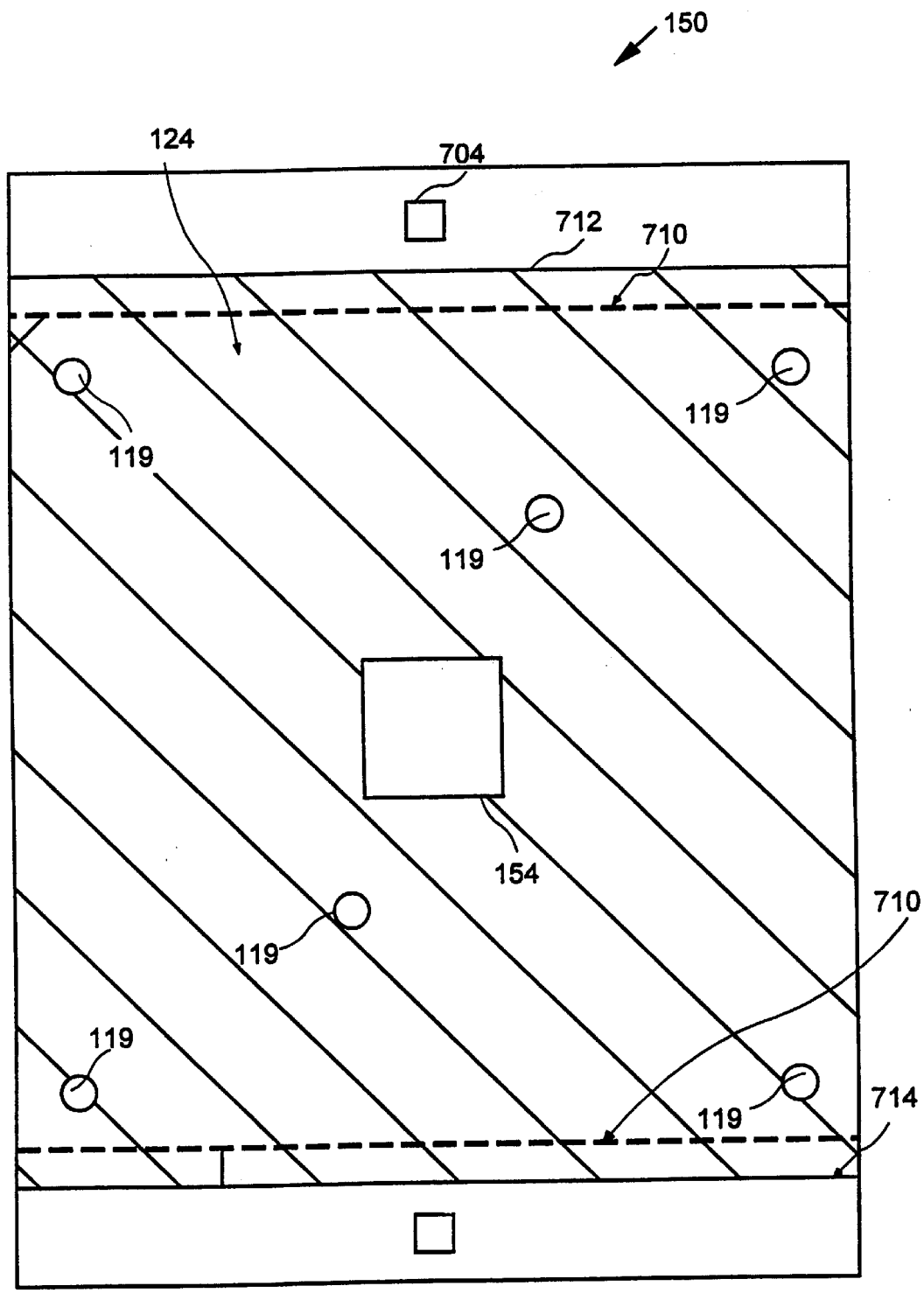
FIG. 7D is a top view of a single flex tape interconnect substrate with the second adhesive, sprocket holes, ground vias and the device aperture in accordance with one embodiment of the present invention.

For manufacturing efficiency, the flex tape interconnect substrate 150 can be arranged in a reel form having adhesive layer 127 in place. By way of example, FIG. 7D illustrates a top view of a single flex tape interconnect substrate 150 site that is ready to be assembled onto the ground plane strip 160'. The adhesive layer 124 width extends between lines 712 and 714 such that the sprocket holes 704 are free of adhesive and are available for the alignment operation with the sprocket holes 704 of the ground plane strip 160', yet the adhesive layer 124 is preferably wider than the package outline 710. Preferably, the flex tape interconnect substrate 150 is aligned in a punch tool using the two sprocket holes 704 that are symmetrically located on either side of the flex tape interconnect substrate 150. Next, the substrate sites 710 are singulated, the cavity openings 154 and vias 119 are mechanically punched-out in a single operation using a suitable punch having the desired pattern. As a result, the punch cuts through the flex tape interconnect substrate 150 having the adhesive layer 124, thereby producing excellent alignment at a low manufacturing cost.

Next, the individual flex tape interconnect substrates 150 sites are aligned to the ground plane strip 160' package sites defined by outlines 710 using the sprocket holes 704. At this point, each flex tape interconnect substrate 150 is attached with the adhesive layer 124 to the ground plane strip 160'. However, caution should be taken to avoid inclusion of air bubbles in the adhesive layer 124.

Figure 7E:
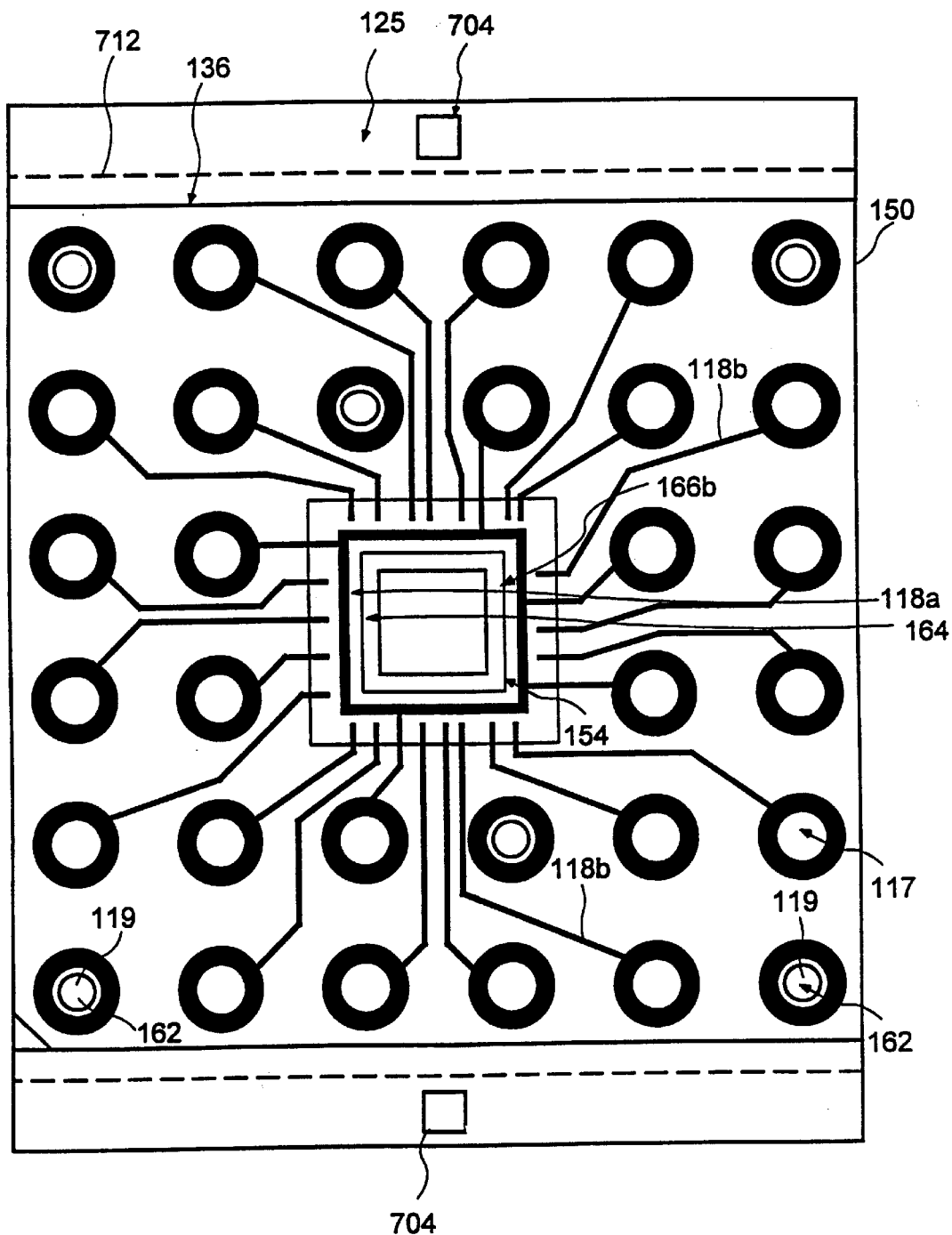
FIG. 7E is a bottom view of a single flex tape interconnect substrate attached to the ground plane in accordance with one embodiment of the present invention.
Figure 7F:
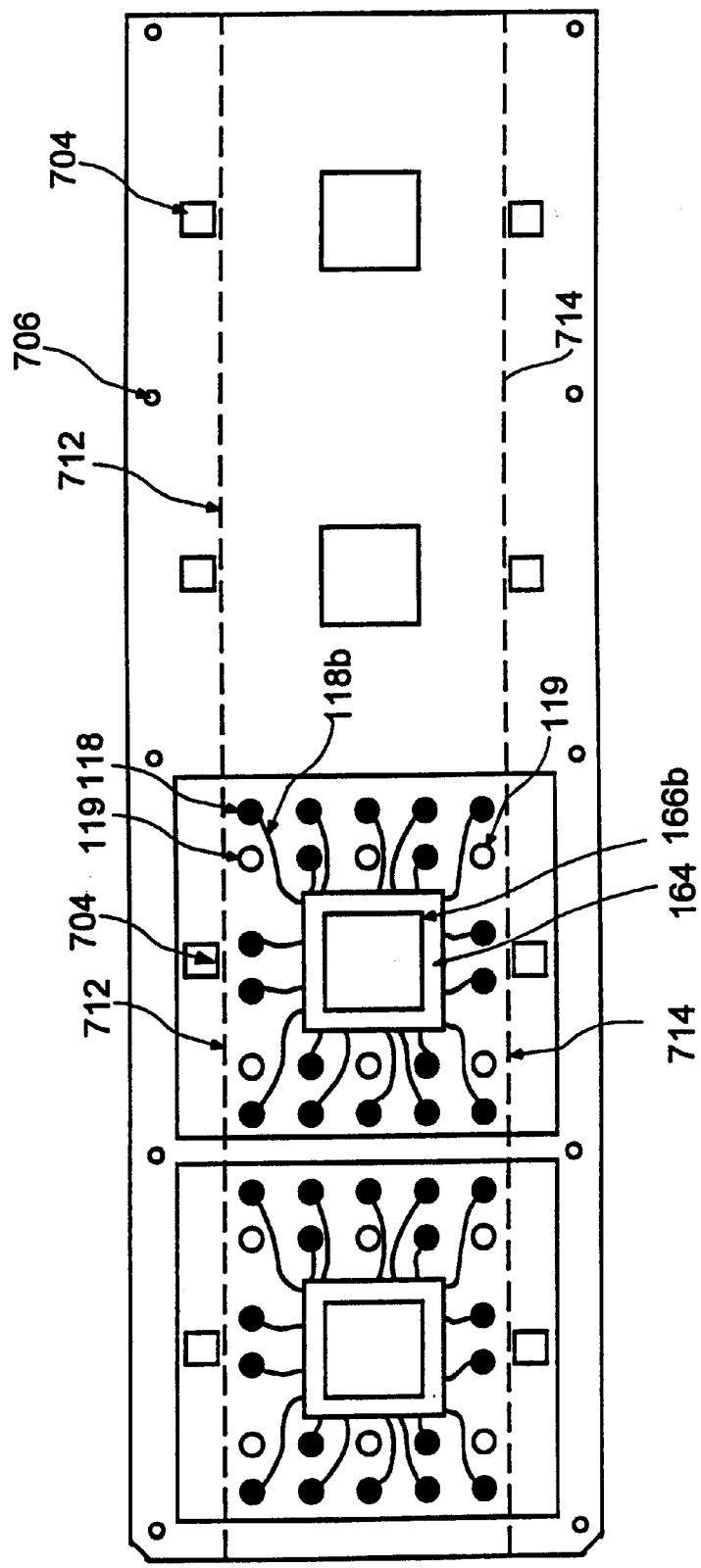
FIG. 7F is a bottom view of a partially assembled package strip with two flex tape interconnect substrate frames attached to the ground plane in accordance with one embodiment of the present invention.

FIG. 7E shows the bottom view of a single flex tape interconnect substrate 150 site that has been attached to the ground plane strip 160' in accordance with one embodiment of the present invention. The vias 119 are aligned to the silver pads 162, and the cavity opening 154 is aligned to the silver plated ground ring 164. FIG. 7F shows two singulated flex tape interconnect substrates 150 attached to the individual package sites 710 on the ground plane strip 160'. Also shown is an outline of the underlying heat spreader strip 110' defined by lines 712 and 714. The process discussed above will therefore continued until all package sites 710 on the ground plane strip 160' have an attached flex tape interconnect substrate 150.

With reference to FIG. 3A, the fabrication process continues by attaching the die 112 to the cavity of the individual package sites with the die attach epoxy 113, after which the die attach epoxy 113 is cured. As mentioned above, additional silver filled epoxy can be dispensed in the cavity to establish an electrical contact between the die 112 and the ground plane 160. The bond pads on the die are then interconnected to by wire bonds 126 to the fingers 118e, the power ring 118a and the ground ring 164 on the ground plane 160. Each cavity is then filled with the encapsulation compound 122 to a predetermined level and subsequently cured to protect the die 112, the wire bonds 126, and maintain a predetermined clearance "D" from the crown of the solder balls.

As mentioned earlier, solder paste is applied to fill the ground vias 119 and then reflowed to fill the vias with solder and form a substantially even surface with the ball pad metal 117. Advantageously, this provides an even surface for all pads during the next step of flux application. Generally, after the flux is applied, the solder balls 120 and 120a are placed on all the solder ball pads (i.e., those overlying a metal pad 117 and those overlying a via filled ground via 119), and subsequently reflowed to form an electrical and metallurgical bond to the pads. As such, the ground solder balls 120a are in direct contact with the ground plane 160 and the remaining power and signal balls are in direct contact with the metal pads 117 of the flex tape interconnect substrates 150 as shown in FIG. 3A.

The packages are then singulated by punching the flex tape interconnect substrates 150, ground plane strip 160' and heat spreader strip 110', thereby defining the package perimeter 710 in one efficient fabrication step. As will be apparent to those skilled in the art, this efficient singulation ensures a clean package edge that has substantially no misalignments between the different package layers.

It should be understood that the above assembly process can be used for the first and third embodiments that implement the encapsulation 122. However, in the second embodiment where a lid 222 is used, the lid 222 is attached following the wire bonding operation. By way of example, a lid adhesive is first dispensed and then the lid 222 is attached and the epoxy is cured. The remaining steps are as described above.

The assembly process of the flip chip embodiment of FIGS. 6A through 6C, though similar to the process described above, differ in the following sequence of operations. The ground plane strip 160' does not have a silver plated ground ring 164, but otherwise is substantially the same as in the previous embodiments. Similarly the heat spreader strip 110' is substantially the same, and is assembled using the same process as in the previous embodiments. The bump pads 218a on the flex tape interconnect substrate 150" are fluxed, and the solder bumps 320 are aligned to the bump pads 218a. The solder bumps 320 are then reflowed to form a metallurgical and electrical bond to the flex tape interconnect substrate 150". Subsequently, the space between the die 112 and the flex tape interconnect substrate 150" is filled with the underfill epoxy 322 and cured. This provides a suitable protective coating for the die 112 and the solder bumps 320 from the environment as well as providing mechanical rigidity.

Continuing with the fabrication process of the flip chip arrangement of FIGS. 6A through 6C, the flex tape interconnect substrate 150" sites are singulated and the ground vias 119 are punched in one step as in the previous embodiments. The die attach epoxy 113 is then dispensed in the cavity on the area that is to receive the die 112. The flex tape interconnect substrate 150" is then aligned to the ground plane strip 160' using the sprocket holes 704. The ground plane strip 160' having the flex tape interconnect substrate 150" sites is then attached to the ground plane strip 110' with the adhesive layer 127 and the die 112 is attached to the heat spreader strip 110' with the die attach epoxy 113 in the same operation. The die attach epoxy is subsequently cured to form a permanent bond. The individual packages are then singulated by a mechanical punching as in the previous embodiments.

The ball grid array packages described above can be manufactured by low cost methods using machinery, processes, materials and infrastructure common in the integrated circuit packaging industry. One such method uses the same assembly equipment, processes and support infrastructure used in the assembly of plastic ball grid arrays, which are well established in the packaging industry. By way of example, the use of strip assembly packaging implements assembly techniques that automatically assemble packages via magazine-to-magazine handling.

Although the foregoing invention has been described in some detail for purposes of clarity and understanding, it will be apparent that certain changes and modifications may be practiced within the scope of the appended claims. By way of example, the flex tape interconnect substrate may include additional layered pairs of metal and dielectric for routing additional power and signals, and routing more solder ball tows in high performance applications. Accordingly, the present embodiments are to be considered as illustrative and not restrictive, and the invention is not to be limited to the details given herein, but may be modified within the scope and equivalents of the appended claims.

What is claimed is:

1. A package, comprising:

a heat spreader for dissipating heat;

a ground plane having a first side that is attached to the heat spreader, the ground plane having a first aperture opening that exposes a surface of the heat spreader, the first aperture being configured to receive a chip;

a single metal interconnect substrate configured to be attached to the ground plane, the single metal interconnect substrate having a complementary second aperture over the first aperture of the ground plane; and a conductively filled via defined through the single metal interconnect substrate and in electrical contact with the ground plane.

2. A package as recited in claim 1, wherein the complementary second aperture of the single metal interconnect substrate is larger than the first aperture of the ground plane.

3. A package as recited in claim 1, wherein the single metal interconnect substrate has a plurality of metal traces, the plurality of metal traces being configured to interconnect the chip to associated solder balls that are connected to the single metal interconnect substrate.

4. A ball grid array package, comprising:

a base for dissipating heat;

a metal plane having a first side that is attached to the base, the metal plane having a first aperture opening exposing a surface of the base, the first aperture being configured to surround a die that is configured to be attached to the surface of the base;

a tape interconnect substrate having only one metal layer, the tape interconnect substrate is configured to be attached to the metal plane, and is configured to have a complementary second aperture positioned around the first aperture of the metal plane;

a conductively filled via defined directly through the tape interconnect substrate and in electrical contact with the metal plane; and a solder ball positioned over the conductively filled via.

5. A ball grid array package as recited in claim 4, wherein the metal plane functions as a ground plane, and the conductively filled via and the solder ball establish a ground connection.

\* \* \* \* \*